US008810498B2

(12) United States Patent
Kim et al.

(10) Patent No.: US 8,810,498 B2

(45) Date of Patent: Aug. 19, 2014

(54) GATE DRIVING CIRCUIT AND DISPLAY APPARATUS HAVING THE SAME

(75) Inventors: Sungman Kim, Seoul (KR); Beomjun Kim, Seoul (KR); Bong-Jun Lee, Seoul (KR); Hong-Woo Lee, Cheonan-si (KR); Jae-seung Kim, Incheon (KR); Byung-Su Oh, Daegu (KR)

(73) Assignee: Samsung Display Co., Ltd. (KR)

( * ) Notice: Subject to any disclaimer, the term of this patent is extended or adjusted under 35 U.S.C. 154(b) by 152 days.

(21) Appl. No.: 12/898,090

(22) Filed: Oct. 5, 2010

(65) Prior Publication Data

US 2011/0267326 A1 Nov. 3, 2011

(30) Foreign Application Priority Data

Apr. 29, 2010 (KR) ........................ 10-2010-0040237

(51) Int. Cl.

*G09G 3/36* (2006.01)
*G11C 19/00* (2006.01)

(52) U.S. Cl.

USPC ................. 345/100; 345/87; 345/98; 345/99; 377/64

(58) Field of Classification Search

CPC ...... G11C 19/287; G11C 19/38; G11C 27/04; G11C 29/20; G09G 3/3266; G09G 3/3659; G09G 3/3674; G09G 3/3677; G09G 2310/0286

USPC ................... 345/87, 98–100, 204; 377/64–81

See application file for complete search history.

(56) References Cited

U.S. PATENT DOCUMENTS

| | | | | |
|---|---|---|---|---|
| 2002/0003964 | A1 * | 1/2002 | Kanbara et al. | 396/661 |
| 2005/0008114 | A1 | 1/2005 | Moon | |
| 2005/0156859 | A1 * | 7/2005 | Jang et al. | 345/100 |
| 2006/0098525 | A1 * | 5/2006 | Kim et al. | 365/244 |
| 2006/0221043 | A1 * | 10/2006 | Horibata et al. | 345/100 |
| 2007/0171172 | A1 * | 7/2007 | Chang et al. | 345/98 |

FOREIGN PATENT DOCUMENTS

| | | | |
|---|---|---|---|
| CN | 1326178 | A | 12/2001 |
| CN | 1800926 | A | 7/2006 |
| CN | 101499252 | A | 8/2009 |
| JP | 2004152482 | | 5/2004 |
| JP | 2005222688 | | 8/2005 |
| JP | 2008225476 | A | 9/2008 |
| JP | 2009036945 | A | 2/2009 |
| JP | 2009080365 | A | 4/2009 |
| JP | 2009163862 | | 7/2009 |
| JP | 2010033690 | A | 2/2010 |
| KR | 1020050079718 | | 8/2005 |
| KR | 1020060044119 | | 5/2006 |
| KR | 1020080068420 | | 7/2008 |
| TW | 200729115 | | 8/2007 |

* cited by examiner

*Primary Examiner* — Sumati Lefkowitz
*Assistant Examiner* — David Tung
(74) *Attorney, Agent, or Firm* — Cantor Colburn LLP

(57) ABSTRACT

A gate driving circuit includes a plurality of stages which are connected to each other one after another and each stage of the plurality of stages outputs a gate voltage to a corresponding gate line of a plurality of gate lines in response to at least one clock signal. Each stage of the plurality of stages includes; a voltage output part which outputs the gate voltage, an output driving part which drives the voltage output part, a holding part which holds the gate line at an off-voltage, and a discharge part arranged at a first end of the gate line to discharge the gate line to the off-voltage in response to the gate voltage output from the voltage output part.

21 Claims, 15 Drawing Sheets

GATE DRIVING CIRCUIT AND DISPLAY APPARATUS HAVING THE SAME

This application claims priority to Korean Patent Application No. 2010-40237, filed on Apr. 29, 2010, and all the benefits accruing therefrom under 35 U.S.C. §119, the content of which in its entirety is herein incorporated by reference.

BACKGROUND OF THE INVENTION

1. Field of the Invention

The present invention relates to a gate driving circuit and a display apparatus having the gate driving circuit. More particularly, the present invention relates to a gate driving circuit capable of reducing display defects and a display apparatus having the gate driving circuit.

2. Description of the Related Art

In general, a liquid crystal display ("LCD") includes an LCD panel having a lower substrate, an upper substrate facing the lower substrate and a liquid crystal layer disposed between the lower substrate and the upper substrate. The LCD panel includes a plurality of gate lines, a plurality of data lines and a plurality of pixels each connected to a corresponding gate line and a corresponding data line of the plurality of gate lines and the plurality of data lines.

The LCD includes a gate driving circuit that sequentially outputs a gate pulse to the gate lines and a data driving circuit that outputs a pixel voltage to the data lines. In general, the gate driving circuit and the data driving circuit are mounted on a film or the LCD panel in a chip form.

Recently, an amorphous silicon gate structure in which the gate driving circuit is formed directly on the lower substrate through a thin film process has been widely adopted to reduce the number of the chips used in construction of an LCD. In the amorphous silicon gate structure, the gate driving circuit includes at least one shift register including a plurality of stages connected to each other one after another.

In a conventional gate driving circuit, each stage is reset in response to a gate signal of an immediately subsequent stage (hereinafter referred to as a "next stage"). However, when the gate signal of the next stage is distorted, a function for the reset of each stage arranged in the gate driving circuit is deteriorated, thereby causing defects in the display of an image.

BRIEF SUMMARY OF THE INVENTION

Exemplary embodiments of the present invention provide a gate driving circuit capable of preventing display defects.

Exemplary embodiments of the present invention provide a display apparatus having the gate driving circuit.

According to an exemplary embodiment, a gate driving circuit includes a plurality of stages which are connected to each other one after another, and each stage of the plurality of stages outputs a gate voltage to a corresponding gate line of a plurality of gate lines in response to at least one clock signal. Each stage of the plurality of stages includes a voltage output part which outputs the gate voltage, an output driving part which drives the voltage output part, a holding part which holds the gate line at an off-voltage, and a discharge part arranged at a first end of the gate line to discharge the gate line to the off-voltage in response to the gate voltage output from the voltage output part. In the present exemplary embodiment, the discharge part includes a first discharge circuit which receives the gate voltage output from the voltage output part to discharge the gate voltage to the off-voltage and a second discharge circuit which discharges the gate voltage output from the voltage output part to the off-voltage in response to a discharge control signal.

According to another exemplary embodiment, a display apparatus includes; a plurality of pixels arranged in a matrix configuration, a plurality of gate lines which apply a gate signal to the plurality of pixels, a plurality of data lines which apply a data signal to the plurality of pixels, a gate driver connected to the gate lines to generate the gate signal based on at least one clock signal, a data driver connected to the data lines to generate the data signal, and a controller which controls an operation of the gate driver and the data driver. In the present exemplary embodiment, he gate driver includes a first discharge circuit arranged at a first end of the gate lines to discharge the gate signal to an off-voltage and a second discharge circuit which discharges the gate signal to the off-voltage in response to a discharge control signal output from the controller.

According to the above, each of the stages arranged in the gate driving circuit may be discharged to the off-voltage in a period where the clock signal is not input, thereby reducing display defects.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION

Figure 1:
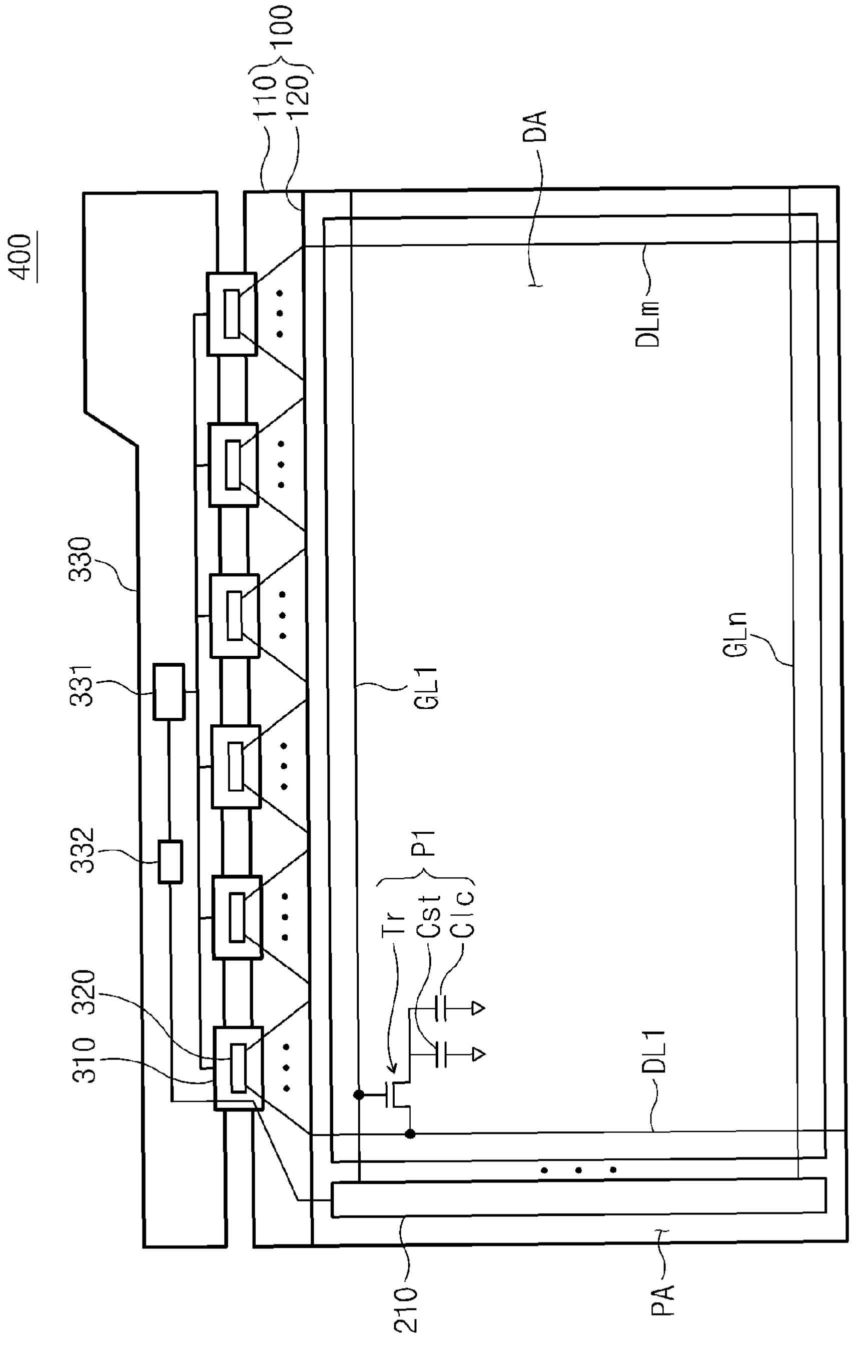
FIG. 1 is a top plan view showing a first exemplary embodiment of a liquid crystal display ("LCD") according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings.

Embodiment 1

FIG. 1 is a top plan view showing a first exemplary embodiment of a liquid crystal display ("LCD") according to the present invention.

Referring to FIG. 1, an LCD 400 includes an LCD panel 100 displaying an image, a plurality of data drivers 320 outputting a data voltage to the LCD panel 100, and a gate driver 210 outputting a gate voltage to the LCD panel 100.

The LCD panel 100 includes a lower substrate 110, an upper substrate 120 facing the lower substrate 110, and a liquid crystal layer (not shown) disposed between the lower substrate 110 and the upper substrate 120. The LCD panel 100 includes a display area DA displaying the image and a peripheral area PA adjacent to the display area DA.

In the display area DA, a plurality of pixel areas is defined in a matrix configuration, and a plurality of gate lines GL1~GLn and a plurality of data lines DL1~DLm disposed substantially perpendicular to and insulated from the gate lines GL1~GLn are arranged on the display area DA. Each pixel area includes a pixel P1 having a thin film transistor ("TFT") Tr, a liquid crystal capacitor Clc, and a storage capacitor Cst. As an example, in one exemplary embodiment the TFT Tr includes a gate electrode electrically connected to a first gate line GL1, a source electrode electrically connected to a first data line DL1, and a drain electrode electrically connected to a pixel electrode that serves as a first electrode of the liquid crystal capacitor Clc. The liquid crystal capacitor Clc and the storage capacitor Cst are connected to the drain electrode in parallel in the present exemplary embodiment.

The gate driving circuit 210 is formed in the peripheral area PA adjacent to one end of the gate lines GL1~GLn. The gate driving circuit 210 is electrically connected to the one end of the gate lines GL1~GLn to sequentially apply the gate voltage to the gate lines GL1~GLn. In one exemplary embodiment, the gate driving circuit 210 may be substantially simultaneously formed with the TFT Tr formed in the pixel area during a manufacturing process of the TFT Tr, although alternative exemplary embodiments include alternative configurations.

In the present exemplary embodiment, a plurality of driving circuit boards 310 is formed in the peripheral area PA adjacent to one end of the data lines DL1~DLm. For example, in one exemplary embodiment the driving circuit boards 310 may be a tape carrier package ("TCP"), a chip-on-film ("COF") or various other similar types of circuit boards. A plurality of data driving chips 320 are mounted on the driving circuit boards 310, respectively. The data driving chips 320 are electrically connected to the one end of the data lines DL1~DLm to apply the data voltage to the data lines DL1~DLm.

The LCD 400 may further include a control circuit 330 to control an operation of the gate driving circuit 210 and the data driving chips 320. In one exemplary embodiment the control circuit 330 may be a PCB. The control circuit 330 outputs image data, a data control signal to control the operation of the data driving chips 320 and a gate control signal to control the operation of the gate driving circuit 210.

The control circuit 330 includes a timing controller 331 that receives the image data from an exterior to generate the data control signal and a gate control circuit 332 that generates the gate control signal. In another exemplary embodiment, the control circuit 330 may be a data circuit that receives a control signal from a separate circuit including a timing controller to generate the data control signal. Exemplary embodiments include configurations wherein all of the circuits may be PCBs.

The timing controller 331 controls the operation of the data driving chips 320 and the gate control circuit 332. The gate control circuit 332 generates the gate control signal including clock signals CKV and CKVB to drive the gate driving circuit 210, a start signal STV to indicate a start of a gate signal, and a discharge control signal RVS-1.

The control circuit 330 applies the data control signal and the image data to the data driving chips 320 through the driving circuit boards 310. In addition, the control circuit 330 applies the gate control signal to the gate driving circuit 210 through the driving circuit board 310 adjacent to the gate driving circuit 210.

Each of the gate driving circuit 210 and the data driving chips 310 may be formed as a single integrated circuit chip to be directly mounted on the LCD panel 100, attached to the LCD panel 100 after being mounted on a flexible printed circuit film (not shown), or mounted on a separate PCB (not shown). In addition, the gate driving circuit 210 and the data driving chips 310 may be integrated on the LCD panel 100 together with the gate lines GL1~GLn, the data lines DL1~DLm, and the TFT Tr. Furthermore, in one exemplary embodiment the gate driving circuit 210, the data driving chips 310, the timing controller 331, and the gate control circuit 332 may be integrated into a single chip. In such an exemplary embodiment, at least one of those circuits 210, 310, 331 and 332 or at least one circuit device thereof may be arranged outside the single chip.

Hereinafter, the gate driving circuit 210 will be described in detail with reference to FIGS. 2 to 4.

Figure 2:
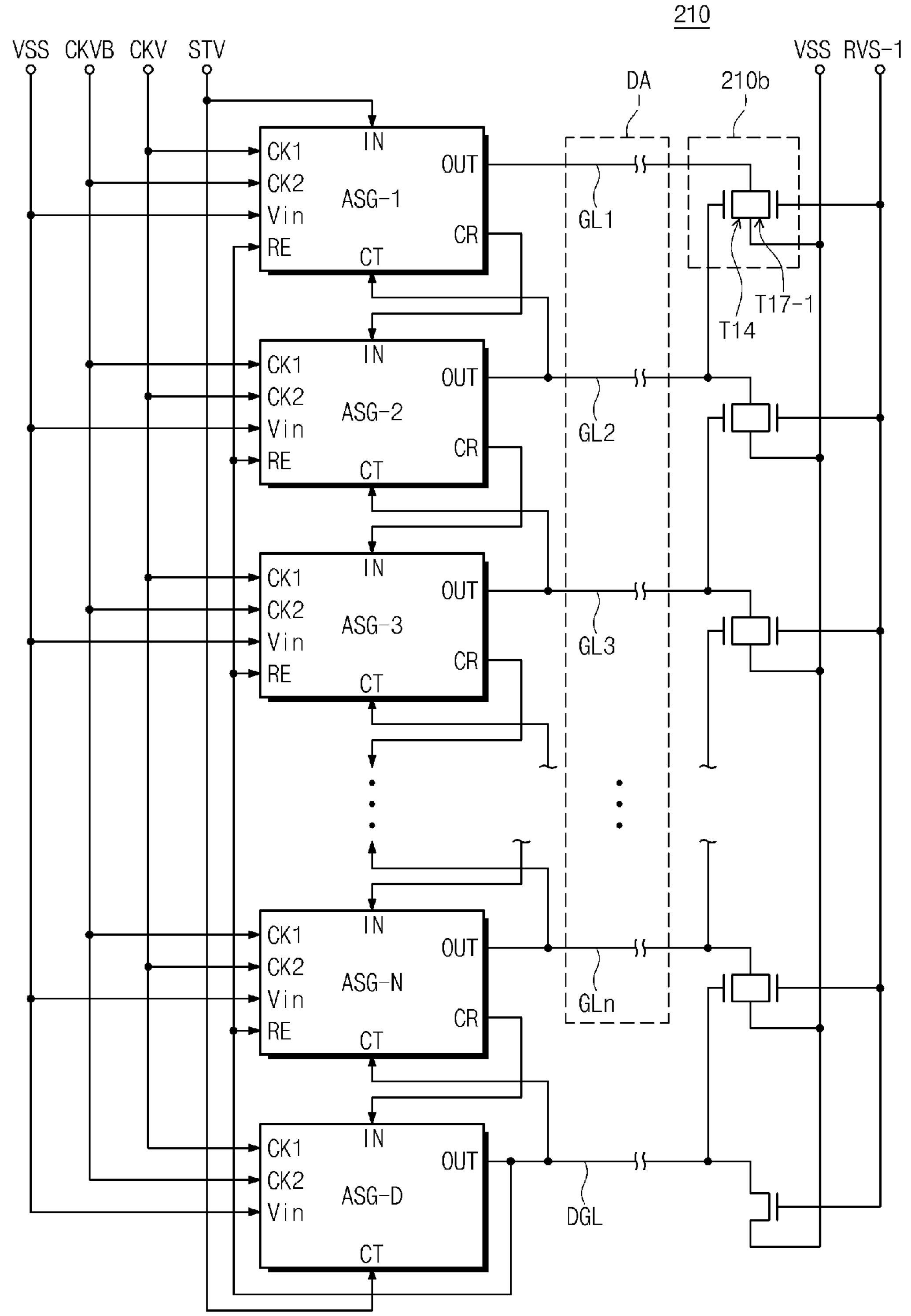
FIG. 2 is a block diagram showing an exemplary embodiment of a gate driving circuit of FIG. 1.

FIG. 2 is a block diagram showing the gate driving circuit of FIG. 1.

Referring to FIG. 2, the gate driving circuit 210 further includes a shift register 210*a* in which a plurality of stages ASG-1~ASG-N and ASG-D are connected to each other one after another and a discharge part 210*b* connected to a corresponding gate line of the gate lines GL1~GLn to discharge a present gate line to an off-voltage VSS in response to a gate voltage output from one of stages after a present stage.

Each of the stages ASG-1~ASG-N and ASG-D includes a first input terminal IN, a first clock terminal CK1, a second clock terminal CK2, a second input terminal CT, a voltage input terminal Vin, a reset terminal RE, an output terminal OUT and a carry terminal CR.

The first input terminal IN1 of each of the stages ASG-2~ASG-N and ASG-D is electrically connected to the carry terminal CR of one of the stages previous to the present stage to receive a carry voltage. In the present exemplary embodiment, each of the stages ASG-2~ASG-N and ASG-D receives the carry voltage from an immediately previous stage. Also, the first input terminal IN1 of a first stage ASG-1 among the stages ASG-1~ASG-N and ASG-D receives the start signal STV indicating the start of the operation of the gate driving circuit 210. The second input terminal CT of each of the stages ASG-1~ASG-N is electrically connected to the output terminal OUT of one of the stages immediately subsequent to the present stage to receive an output voltage. However, the second input terminal CT of a last stage ASG-D among the stages ASG-1~ASG-N and ASG-D receives the start signal STV. The last stage ASG-D serves as a dummy stage to lower the output voltage of a previous stage ASG-N of the last stage ASG-D to an off-voltage level.

The first clock terminal CK1 of each odd-numbered stage ASG-1, ASG-3, . . . , ASGN-1 (wherein N is a natural number) among the stages ASG-1~ASG-N and ASG-D receives the first clock signal CKV, and the second clock terminal CK2 of each of the odd-numbered stages ASG-1, ASG-3, . . . , ASGN-1 among the stages ASG-1~ASG-N and ASG-D receives the second clock signal CKVB having a phase which is different from the first clock signal CKV. The phase of the first and second clock signals CKV and CKVB will be described in detail later. The first clock terminal CK1 of each even-numbered stage ASG-2, . . . ASG-N among the stages ASG-1~ASG-N and ASG-D receives the second clock signal CKVB, and the second clock terminal CK2 of the each of the even-numbered stages ASG-2, . . . ASG-N among the stages ASG-1~ASG-N and ASG-D receives the first clock signal CKV.

The voltage input terminal Vin of each of the stages ASG-1~ASG-N and ASG-D receives the off-voltage VSS; in the present exemplary embodiment the off-voltage VSS that turns off the gate line. In addition, the output terminal OUT of the last stage ASG-D is electrically connected to the reset terminal RE of the stages ASG-1~ASG-N.

Each of the stages ASG-1~ASG-N except for the last stage ASG-D is electrically connected to the corresponding gate line of the gate lines GL1~GLn through its output terminal OUT, and the last stage ASG-D is electrically connected to a dummy gate line DGL. Thus, the stages ASG-1~ASG-N sequentially output the gate voltage through their respective output terminals OUT to apply the gate voltage to the gate lines GL1~GLn. As shown in FIG. 2, the stages ASG-1~ASG-N and ASG-D are arranged at a first end of the gate lines GL1~GLn. Alternative exemplary embodiments include configurations wherein the dummy gate line is omitted or shortened.

The discharge part 210*b* includes a plurality of individual discharge parts 210*b* corresponding to the gate lines GL1~GLn, respectively. Each discharge part 210*b* includes a first discharge transistor T14 and a second discharge transistor T17-1 to discharge the present gate line among the gate lines GL1~GLn to the off-voltage VSS.

The first discharge transistor T14 includes a control electrode connected to a next gate line, an input electrode receiving a gate voltage of the present stage, and an output electrode receiving the off-voltage VSS. The second discharge transistor T17-1 includes a control electrode receiving the discharge control signal RVS-1 generated from the gate control circuit 332 shown in FIG. 1, an input electrode receiving the gate voltage of the present stage, and an output electrode receiving the off-voltage VSS. Detailed descriptions of an operation of the discharge part 210*b* will be described in more detail later.

Figure 3:
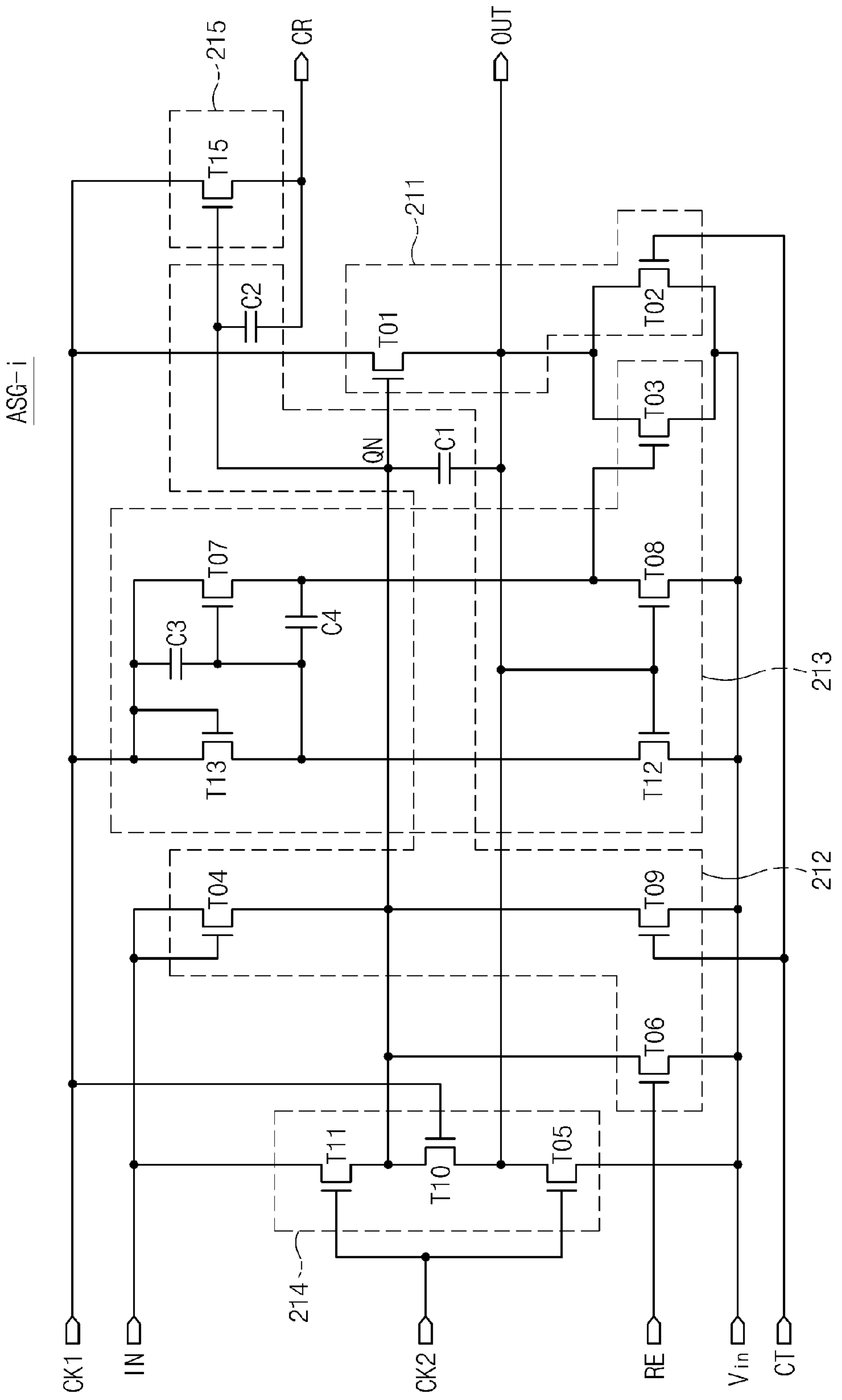
FIG. 3 is a circuit diagram showing an exemplary embodiment of one stage of a gate driving circuit.

FIG. 3 is a circuit diagram showing an exemplary embodiment of one stage of the gate driving circuit. In FIG. 3, the stages of the gate driving circuit 210 have the same circuit configuration and function except for the dummy stage ASG-D, and thus an inner circuit configuration of one stage (e.g., i-th stage ASG-i) will be illustrated as a representative stage.

Referring to FIG. 3, the stage ASG-i includes a voltage output part 211 applying a gate on/off voltage to a corresponding gate line, an output driving part 212 driving the voltage output part 211, and a first holding part 213 and a second holding part 214 holding the corresponding gate line at the off-voltage VSS.

The voltage output part 211 includes a pull-up transistor T01 and a pull-down transistor T02. The pull-up transistor T01 includes a control electrode connected to an output terminal (hereinafter, referred to as a Q-node QN) of the output driving part 212, an input electrode connected to the first clock terminal CK1, and an output electrode connected to the output terminal OUT. Pull-up transistor T01 pulls up the gate voltage of the present stage output from the output terminal OUT to the first clock signal CKV (shown in FIG. 2) applied through the first clock terminal CK1 in response to a control voltage output from the output driving part 212. The pull-up transistor T01 is turned on during a 1H period that corresponds to a high period of the first clock signal CKV in one frame and maintains the gate voltage of the present stage at a high state during the 1H period.

The pull-down transistor T02 includes a control electrode connected to the second input terminal CT, an output electrode connected to the voltage input terminal Vin, and an input electrode connected to the output terminal OUT. Thus, the pull-down transistor T02 pulls down the gate voltage of the present stage, which is pulled up by the first clock signal CKV, to the off-voltage VSS (shown in FIG. 2) applied through the voltage input terminal Vin in response to a gate voltage of a next stage. That is, the pull-down transistor T02 is turned on after the 1H period to lower the gate voltage of the present stage to a low state.

The output driving part 212 includes a buffer transistor T04, a first capacitor C1, a second capacitor C2, a discharge transistor T09 and a reset transistor T06.

The buffer transistor T04 includes an input electrode and a control electrode that are commonly connected to the first input terminal IN and an output electrode connected to the Q-node QN. The first capacitor C1 is connected between the Q-node QN and the output terminal OUT, and the second capacitor C2 is connected between a control electrode of a carry transistor T15 and the carry terminal CR. Meanwhile, the discharge transistor T09 includes an input electrode connected to the output electrode of the buffer transistor T04, a control electrode connected to the second input terminal CT, and an output electrode connected to the voltage input terminal Vin.

The reset transistor T06 includes a control electrode connected to the reset terminal RE, an input electrode connected to the control electrode of the pull-up transistor T01, and an output electrode connected to the voltage input terminal Vin. The reset transistor T06 discharges a ripple voltage input through the first input terminal IN to the off-voltage VSS in response to a final carry voltage input through the reset terminal RE and output from the last stage ASG-D. Accordingly, the pull-up transistor T01 and the carry transistor T15 are turned off in response to the last carry voltage from the last stage ASG-D. Consequently, the last carry voltage is provided to reset terminal RE of N previous stages and thus the pull-up transistor T01 and the carry transistor T15 arranged in each of the N previous stages are turned off, thereby resetting the N previous stages.

When the buffer transistor T04 is turned on in response to a carry voltage of a previous stage, the first capacitor C1 and the second capacitor C2 are charged. When the first capacitor C1 is charged with an electric charge above a threshold voltage Vth of the pull-up transistor T01, an electric potential of the Q-node QN becomes higher than the threshold voltage Vth to turn on the pull-up transistor T01 and the carry transistor T15. Since the first clock signal CKV is in a low state, the gate voltage and the carry voltage of the present stage are maintained at the low state during a low period 1H of the first clock signal CKV. Then, when the first clock signal CKV is transitioned to a high state, the first clock signal CKV is applied to the output terminal OUT and the carry terminal CR, so that the gate voltage and the carry voltage of the present stage are transitioned to the high state. That is, the gate voltage and the carry voltage of the present stage are maintained at the high state during the high period 1H of the first clock signal CKV.

Then, when the discharge transistor T09 is turned on in response to the gate voltage of the next stage, the electric charges charged to the first capacitor C1 are discharged to the off-voltage VSS through the discharge transistor T09. Thus, the electric potential of the Q-node QN is lowered to the off-voltage VSS. As a result, the pull-up transistor T01 and the carry transistor T15 are turned off. That is, the discharge transistor T09 is turned on after the 1H period to turn off the pull-up transistor T01 and the carry transistor T15, thereby preventing the gate voltage and the carry voltage of the present stage, which is in the high state, from being output to the output terminal OUT and the carry terminal CR, respectively.

The first holding part 213 includes a first inverter transistor T13, a second inverter transistor T07, a third inverter transistor T12, a fourth inverter transistor T08, and a fifth inverter transistor T03, a third capacitor C3, and a fourth capacitor C4.

The first inverter transistor T13 includes an input electrode and a control electrode that are commonly connected to the first clock terminal CK1 and the third capacitor C3 and an output electrode connected to an output electrode of the second inverter transistor T07 through the fourth capacitor C4. The second inverter transistor T07 includes an input electrode connected to the first clock terminal CK1 and the third capacitor C3, a control electrode connected to the input electrode thereof through the third capacitor C3, and an output electrode connected to a control electrode of the fifth inverter transistor T03. The third inverter transistor T12 includes an input electrode connected to the output electrode of the first inverter transistor T13, a control electrode connected to the output terminal OUT, and an output electrode connected to the voltage input terminal Vin. The fourth inverter transistor T08 includes an input electrode connected to a control electrode of the fifth inverter transistor T03 and an output of the second inverter transistor T07, a control electrode connected to the output terminal OUT, and an output electrode connected to the voltage input terminal Vin. The fifth inverter transistor T03 includes the control electrode connected to the output electrode of the second inverter transistor T07, an input electrode connected to the voltage input terminal Vin, and an output electrode connected to the output terminal OUT.

The third and fourth inverter transistors T12 and T08 are turned on in response to the gate voltage at the high state of the present stage, which is input to the output terminal OUT, and the first clock signal CKV output from the first and second inverter transistors T13 and T07 is discharged to the off-voltage VSS when the gate voltage is at the high state. Thus, the fifth inverter transistor T03 is maintained at the turn-off state during the 1H period in which the gate voltage of the present stage is maintained at the high state. Then, when the gate voltage of the present stage transitions to the low state, the third and fourth inverter transistors T12 and T08 are turned off. Therefore, the fifth inverter transistor T03 is turned on in response to the first clock signal CKV output from the first and second inverter transistors T13 and T07. As a result, the gate voltage of the present stage is held at the off-voltage VSS by the fifth inverter transistor T03 during the high period of the first clock signal CKV within a period (hereinafter, referred to as (n-1)H) excluding the 1H period in a single frame.

The second holding part 214 includes a first ripple preventing transistor T10, a second ripple preventing transistor T11, and a third ripple preventing transistor T05 to prevent the gate voltage and the carry voltage of the present stage from being rippled by the first clock signal CKV or the second clock signal CKVB during the (n-1)H period in a single frame.

The first ripple preventing transistor T10 includes a control electrode connected to the first clock terminal CK1, an input electrode connected to the output terminal OUT, and an output electrode connected to the Q-node. The second ripple preventing transistor T11 includes a control electrode connected to the second clock terminal CK2, an input electrode connected to the first input terminal IN, and an output electrode connected to the Q-node QN. The third ripple preventing transistor T05 includes a control electrode connected to the second clock terminal CK2, an input electrode connected to the output terminal OUT, and an output electrode connected to the voltage input terminal Vin.

The first ripple preventing transistor T10 applies the gate voltage of the present stage, which is output from the output terminal OUT and has the same voltage level as the off-voltage VSS, to the Q-node QN in response to the first clock signal CKV. Thus, the electric potential of the Q-node QN is maintained at the off-voltage VSS during the high period of the first clock signal CKV in the (n-1)H period. Consequently, the first ripple preventing transistor T10 may prevent the pull-up transistor T01 and the carry transistor T15 from being turned on during the high period of the first clock signal CKV in the (n-1)H period.

The second ripple preventing transistor T11 applies the output voltage of the previous stage, which is input through the first input terminal IN and has substantially the same voltage level as the off-voltage VSS, to the Q-node QN in response to the second clock signal CKVB input through the second clock terminal CK2. Thus, the electric potential of the Q-node QN is maintained at the off-voltage VSS during the high period of the second clock signal CKVB in the (n-1)H period. Consequently, the second ripple preventing transistor T11 may prevent the pull-up transistor T01 and the carry transistor T15 from being turned on during the high period of the second clock signal CKVB in the (n-1)H period.

The third ripple preventing transistor T05 discharges the gate voltage of the present stage to the off-voltage VSS in response to the second clock signal CKVB. Thus, the third ripple preventing transistor T05 maintains the gate voltage of the present stage at the off-voltage VSS during the high period of the second clock signal CKVB in the (n-1)H period.

Each stage further includes a carry part 215 that transmits the output voltage of the present stage to the next stage. The carry part 215 includes the carry transistor T15 which has a control electrode connected to the Q-node QN, an input electrode connected to the first clock terminal CK1, and an output electrode connected to the output terminal OUT. Thus, the carry transistor T15 pulls up the carry voltage of the present stage to the first clock signal CKV in response to a control voltage output from the output driving part 212. The carry transistor T15 is turned on during the 1H period in the single frame, thereby maintaining the carry voltage of the present stage at the high state during the 1H period.

Figure 4:
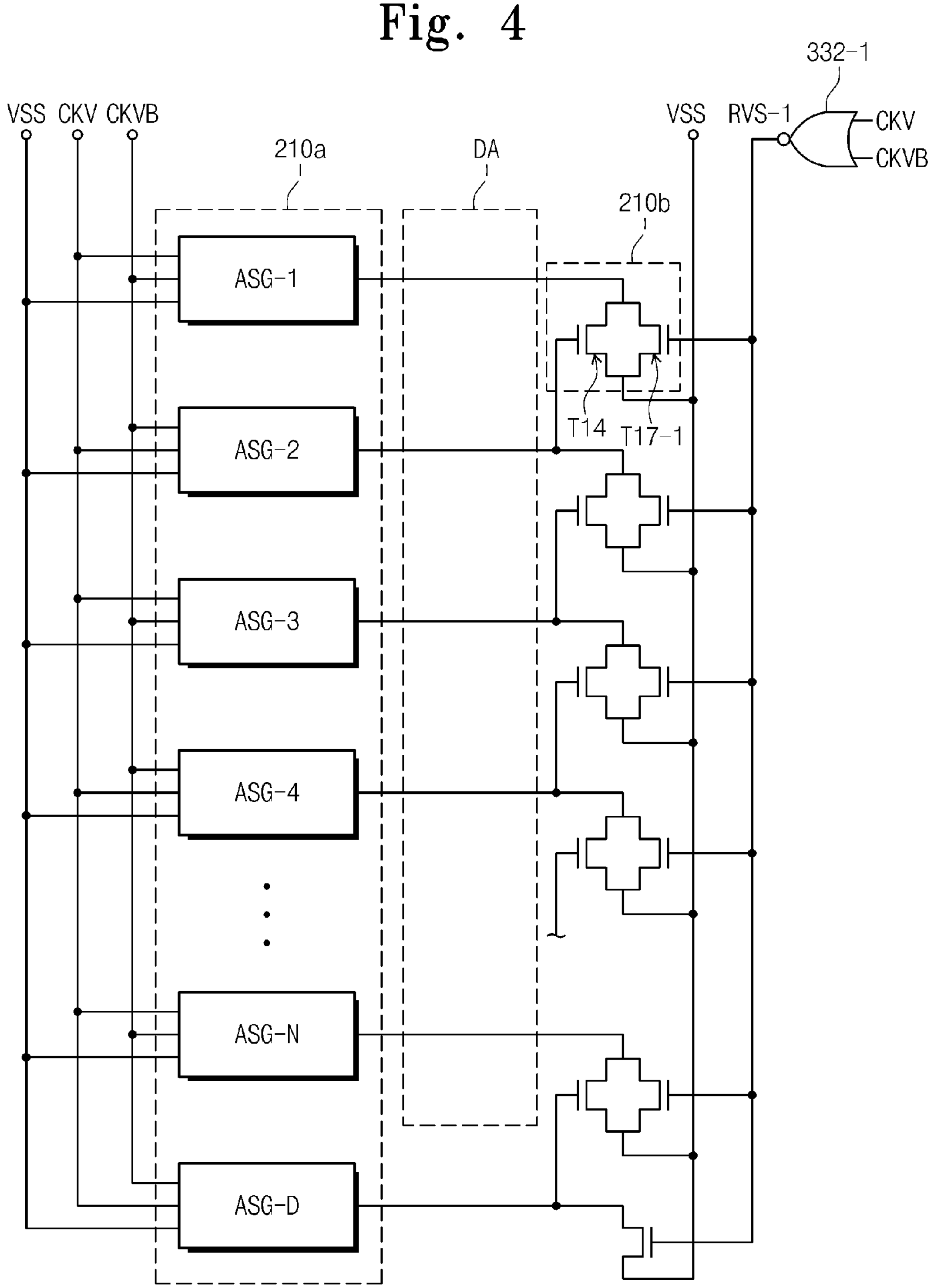
FIG. 4 is a block diagram showing an exemplary embodiment of a gate driving circuit of FIG. 1.
Figure 5:
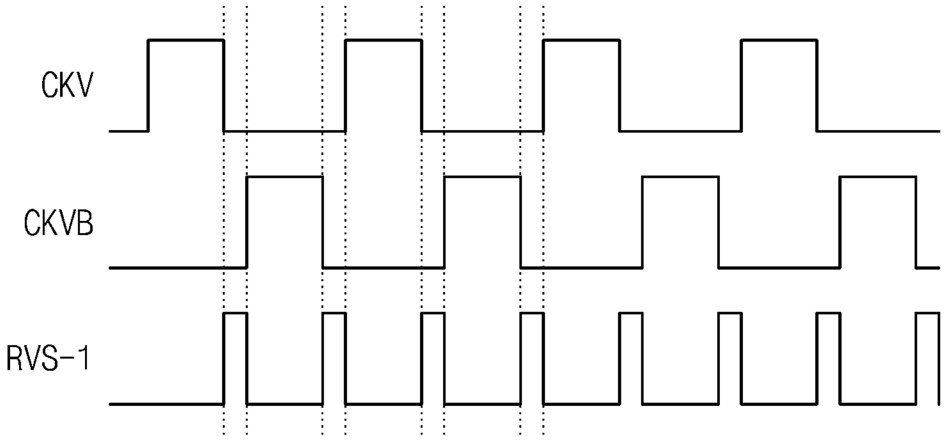
FIG. 5 is a timing diagram showing a first clock signal, a second clock signal and a discharge control signal of FIG. 4.

FIG. 4 is a block diagram showing the exemplary embodiment of a gate driving circuit of FIG. 1, and FIG. 5 is a timing diagram showing the first clock signal, the second clock signal and the discharge control signal of FIG. 4.

Referring to FIG. 4, the shift register 210*a* of the gate driving circuit 210 receives the first clock signal CKV and the second clock signal CKVB to output the gate voltage to the corresponding gate line through the operation of the circuit shown in FIG. 3. In the odd-numbered stages ASG-1, ASG-3, . . . ASG-N-1, the first clock signal CKV is used as the gate voltage and the second clock signal CKVB is used as the clock signal to prevent the occurrence of the ripple effect. In the even-numbered stages ASG-2, . . . ASG-N, the second clock signal CKVB is used to as the gate voltage and the first clock signal CKV is used as the clock signal to prevent the occurrence of the ripple effect.

In the present exemplary embodiment, each of the first clock signal CKV and the second clock signal CKVB has a duty ratio smaller than about 50%. As an example, in one exemplary embodiment each of the first clock signal CKV and the second clock signal CKVB in FIG. 4 has the duty ratio of about 37.5%. In addition, the first clock signal CKV and the second clock signal CKVB have a phase difference of about 180 degrees. When each of the first and second clock signals CKV and CKVB has a duty ratio smaller than about 50%, there is a period during which both of the first and second clock signals CKV and CKVB are in the low state.

When either the first clock signal CKV or the second clock signal CKVB is in the high state, the present stage is normally operated. However, when both of the first clock signal CKV and the second clock signal CKVB are in the low state at the same time, all driving transistors included in the present stages are not operated, so that all nodes of the present stage are in a floating state; e.g., charged with a floating potential. When all nodes of the present stages are in the floating state, the gate voltage applied to the present gate line may be delayed. Specifically, the driving transistors that lower the present gate voltage to the off-voltage VSS in response to the present gate voltage applied from the next stage are not normally operated, and thus the delay time of the present gate voltage increases. The delay time becomes much more longer with proximity to a right side of the LCD panel 100; i.e., a delay time is greater at a right side of the LCD panel 100 than at a left side of the LCD panel 100.

Thus, in order to reduce the delay time of the present gate voltage, the discharge part 210*b* includes the first discharge transistor T14 and the second discharge transistor T17-1. The second discharge transistor T17-1 receives the discharge control signal RVS-1 from the gate control circuit 332 to lower the present gate voltage of the present gate line to the off-voltage VSS.

Meanwhile, the gate control circuit 332 includes a NOR gate circuit 332-1 that receives the first and second clock signals CKV and CKVB and outputs the discharge control signal RVS-1 at the high state when both of the first and second clock signals CKV and CKVB are in the low state. Therefore, the discharge control signal RVS-1 is input to the control electrode of the second discharge transistor T17-1 at a high state when both of the first and second clock signals CKV and CKVB are in the low state. When the second discharge transistor T17-1 is turned on in response to the discharge control signal RVS-1, the output voltage of the present stage is discharged to the off-voltage VSS. Consequently, the delay of the present gate voltage applied to the present gate line may be prevented.

The first discharge transistor T14 maintains the present gate voltage applied to the present gate line at the off-voltage VSS in response to the next gate voltage of the next stage. However, since the last stage ASG-D is the ultimate stage and the last stage ASG-D does not receive a gate voltage provided from a subsequent stage, the output voltage output from the last stage ASG-D is discharged to the off-voltage VSS by the second discharge transistor T17-1.

In the present exemplary embodiment, the NOR gate circuit 332-1 may be embodied through additional software in the gate control circuit 332, although alternative exemplary embodiments include configurations wherein the NOR gate circuit 332-1 is physically embodied through a separate NOR gate circuit.

Embodiment 2

Figure 6:
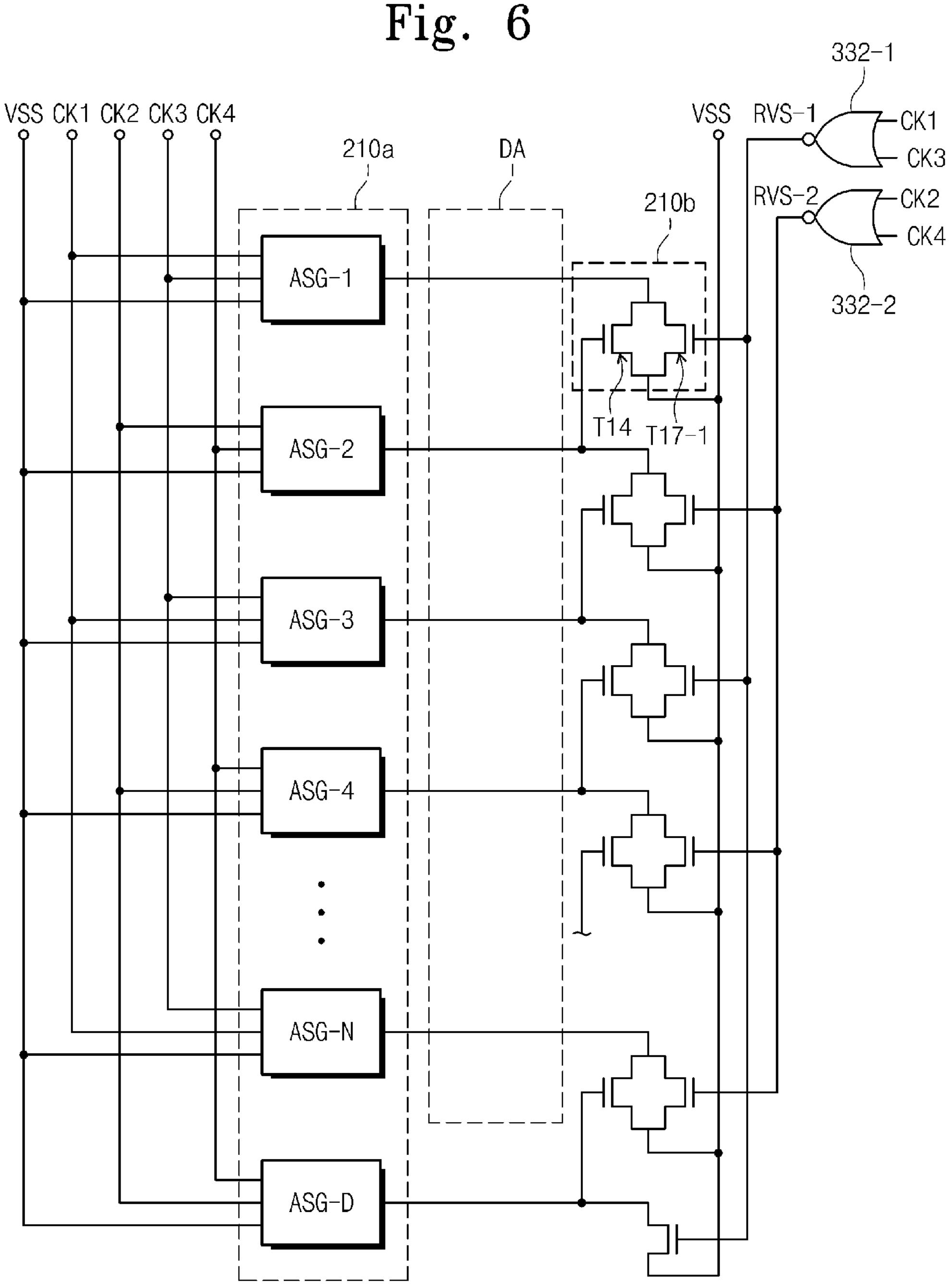
FIG. 6 is a block diagram showing a second exemplary embodiment of a gate driving circuit according to the present invention.
Figure 7:
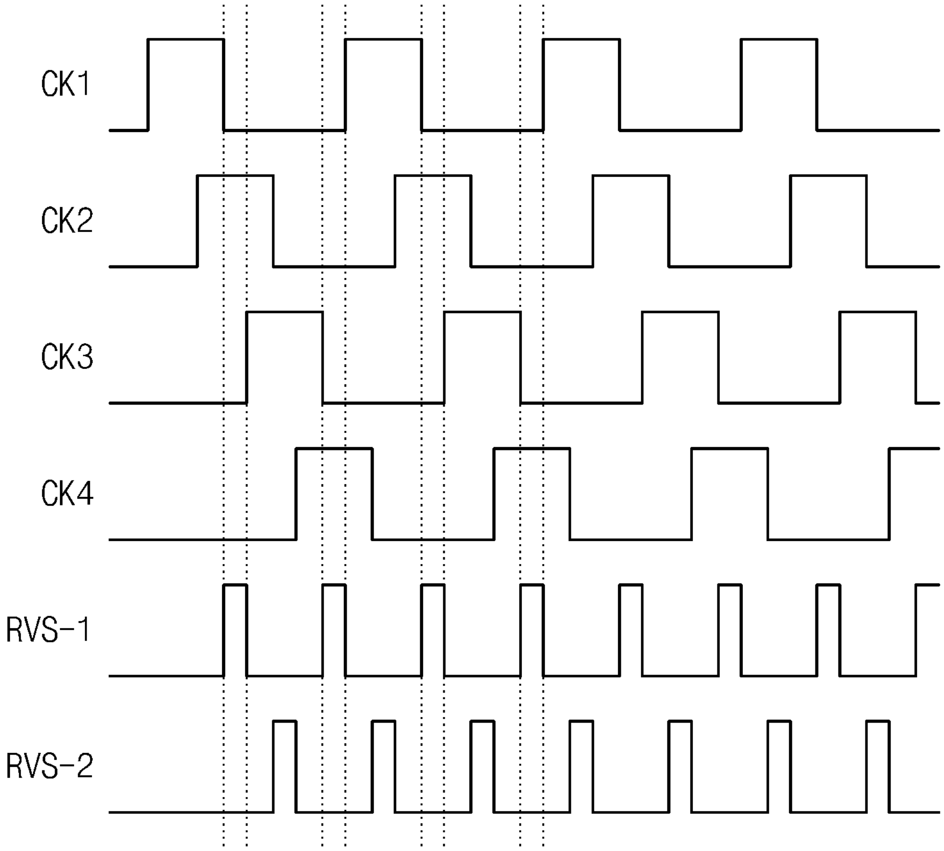
FIG. 7 is a timing diagram showing first to fourth clock signals and first and second discharge control signals of FIG. 6.

FIG. 6 is a block diagram showing a second exemplary embodiment of a gate driving circuit according to the present invention, and FIG. 7 is a timing diagram showing first to fourth clock signals and a discharge control signal of FIG. 6. In FIGS. 6 and 7, the same reference numerals denote the same elements in the first exemplary embodiment, and thus the detailed descriptions of the same elements will be omitted.

Referring to FIGS. 6 and 7, each stage of a gate driving circuit 210 receives two of a first clock signal CK1, a second clock signal CK2, a third clock signal CK3, and a fourth clock signal CK4 to output a gate voltage. In the present exemplary embodiment, odd-numbered stages receive the first clock signal CK1 and the third clock signal CK3, and even-numbered stages receive the second clock signal CK2 and the fourth clock signal CK4. In a first odd-numbered stage ASG-1, the first clock signal CK1 is used as the gate voltage and the third clock signal CK3 is used as a clock signal to prevent occurrence of a ripple effect.

Then, in a next odd-numbered stage ASG-3, i.e., a second odd-numbered stage, the third clock signal CK3 is used as the gate voltage and the first clock signal CK1 is used as the clock signal to prevent the occurrence of the ripple effect. In a first even-numbered stage ASG-2, the second clock signal CK2 is used as the gate voltage and the fourth clock signal CK4 is used as the clock signal to prevent the occurrence of the ripple effect. Then, in a next even-numbered stage ASG-4, i.e., a second even-numbered stage, the fourth clock signal CK4 is used as the gate voltage and the second clock CK2 is used as the clock signal to prevent the occurrence of the ripple effect.

Meanwhile, the gate control circuit 332 includes a first NOR gate circuit 332-1 and a second NOR gate circuit 332-2. The first NOR gate circuit 332-1 receives the first clock signal CK1 and the third clock signal CK3 and outputs a first discharge control signal RVS-1 having a high state when both of the first and third clock signals CK1 and CK3 are in a low state. The second NOR gate circuit 332-2 receives the second clock signal CK2 and the fourth clock signal CK4 and outputs a second discharge control signal RVS-2 having a high state when both of the second and fourth clock signals CK2 and CK4 are in the low state. In the present exemplary embodiment, each of the first to fourth clock signals CK1~CK4 has a duty ratio smaller than about 50%. As an example, in one exemplary embodiment each of the first to fourth clock signals CK1~CK4 may have a duty ratio of about 37.5%. In addition, the first clock signal CK1 and the third clock signal CK3 have a phase difference of about 180 degrees and the second clock signal CK2 and the fourth clock signal CK4 have a phase difference of about 180 degrees.

When either the first clock signal CK1 or the third clock signal CK3 is in the high state, the odd-numbered stages are normally operated, and when either the second clock signal CK2 or the fourth clock signal CK4 is in the high state, the even-numbered stages are operated normally. However, when both of the first and third clock signals CK1 and CK3 are in the low state or both of the second and fourth clock signals CK2 and CK4 are in the low state, all nodes of the odd-numbered stages and the even-numbered stage are in a floating state.

In the second exemplary embodiment, when both of the first clock signal CK1 and the third clock signal CK3 are in the low state, the first NOR gate circuit 332-1 outputs the first discharge control signal RVS-1 having the high state, so that all nodes of the odd-numbered stages are not charged with the floating state. In addition, when both of the second clock signal CK2 and the fourth clock signal CK4 are in the low state, the second NOR gate circuit 332-2 outputs the second discharge control signal RVS-2 in the high state such that all nodes of the even-numbered stages are not charged with the floating state.

To this end, the first discharge control signal RVS-1 output from the first NOR gate circuit 332-1 is input to a control electrode of the second discharge transistor T17-1 of the odd-numbered stages. When the second discharge transistor T17-1 of the odd-numbered stages is turned on in response to the first discharge control signal RVS-1, an output voltage of each stage is discharged to an off-voltage VSS. In addition, the second discharge control signal RVS-2 output from the second NOR gate circuit 332-2 is input to a control electrode of the second discharge transistor T17-1 of the even-numbered stages. When the second discharge transistor T17-1 is turned on in response to the second discharge control signal RVS-2, the output voltage of each stage is discharged to the off-voltage VSS. As a result, all nodes of each stage may be maintained at an off-state in a period during which the first and third clock signals CK1 and CK3 are in the low state and a period during which the second and fourth clock signals CK2 and CK4 are in the low state.

Meanwhile, since the first discharge transistor T14 is operated by receiving an output voltage of a next stage through its control electrode, all nodes of a present stage are maintained at the off-state by the operation of the next stage. The output voltage output from the last stage ASG-D is discharged to the off-voltage VSS by the second discharge transistor T17-1 since the last stage ASG-D, which is a dummy stage, does not receive the output voltage provided from a subsequent stage.

Embodiment 3

Figure 8:
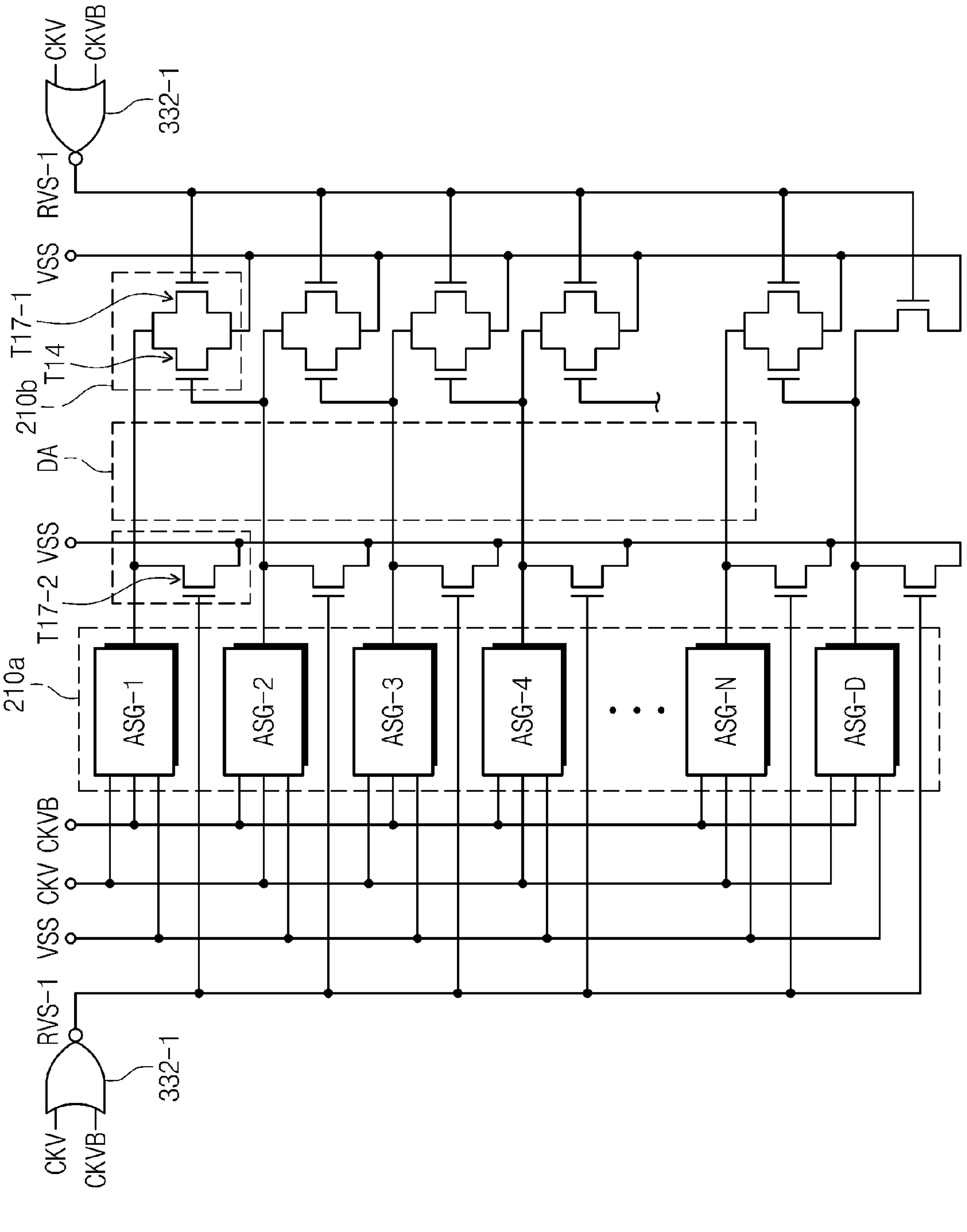
FIG. 8 is a block diagram showing a third exemplary embodiment of a gate driving circuit according to the present invention.

FIG. 8 is a block diagram showing a third exemplary embodiment of a gate driving circuit according to the present invention. In FIG. 8, the same reference numerals denote the same elements in the first and second exemplary embodiments, and thus the detailed descriptions of the same elements will be omitted.

Referring to FIG. 8, each stage of a gate driving circuit 210 receives a first clock signal CKV and a second clock signal CKVB to output a gate voltage to a corresponding gate line through the operation of the circuit shown in FIG. 3. In odd-numbered stages, the first clock signal CKV is used as the gate voltage and the second clock signal CKVB is used as a clock signal to prevent the occurrence of the ripple effect. In even-numbered stages, the second clock signal CKVB is used as the gate voltage and the first clock signal CKV is used as the clock signal to prevent the occurrence of the ripple effect.

A gate control circuit 332 includes a NOR gate circuit 332-1 that receives the first and second clock signals CKV and CKVB and outputs a discharge control signal RVS-1 having a high state when both of the first and second clocks CKV and CKVB are in a low state. In the present exemplary embodiment, each of the first and second clock signals CKV and CKVB has a duty ratio smaller than about 50%. As an example, in one exemplary embodiment each of the first to second clock signals CKV and CKVB may have a duty ratio of about 37.5%. In addition, the first clock signal CKV and the second clock signal CKVB have a phase difference of about 180 degrees.

A discharge part 210*b* according to the present exemplary embodiment includes a first discharge transistor T14 receiving an output voltage from a next gate line to discharge a present gate line to an off-voltage VSS, a second discharge transistor T17-1, and a third discharge transistor T17-2 discharging the present gate line to the off-voltage VSS in response to the discharge control signal RVS-1.

The first discharge transistor T14 includes a control electrode connected to the next gate line, an input electrode receiving the gate voltage of a present stage, and an output electrode receiving the off-voltage VSS. The second discharge transistor T17-1 includes a control electrode receiving the discharge control signal RVS-1 generated from the NOR gate circuit 332-1, an input electrode receiving the gate voltage of the present stage, and an output electrode receiving the off-voltage VSS. The third discharge transistor T17-2 includes a control electrode receiving the discharge control signal RVS-1 generated from the NOR gate circuit 332-1, an input electrode receiving the gate voltage of the present stage, and an output electrode receiving the off-voltage VSS. The single NOR circuit 332-1 of FIG. 8 is illustrated on both sides of the shift register for the clarity of the drawing; NOR circuit 332-1 is the same element on both sides of the shift register. The second discharge transistor T17-1 is arranged at a first end of gate lines, and the third discharge transistor T17-2 is arranged at a second end of the gate lines. That is, the second and third discharge transistors T17-1 and T17-2 are arranged at opposite positions with reference to the display area DA interposed therebetween.

The discharge control signal RVS-1 output from the NOR gate circuit 332-1 is applied to the control electrode of the second discharge transistor T17-1 and the control electrode of the third discharge transistor T17-2. When the second and third discharge transistors T17-1 and T17-2 are turned on in response to the discharge control signal RVS-1, the output voltage of the present stage is discharged to the off-voltage VSS. Accordingly, all nodes of the present stage are maintained at an off-state.

Meanwhile, since the first discharge transistor T14 is operated by receiving the output voltage of a next stage through its control electrode, all nodes of the present stage are maintained at the off-state by the operation of the next stage. The last stage ASG-D, which is a dummy stage, does not receive the output voltage from a subsequent stage, so the output voltage output from the last stage ASG-D is discharged to the off-voltage VSS by the second and third discharge transistors T17-1 and T17-2.

Embodiment 4

Figure 9:
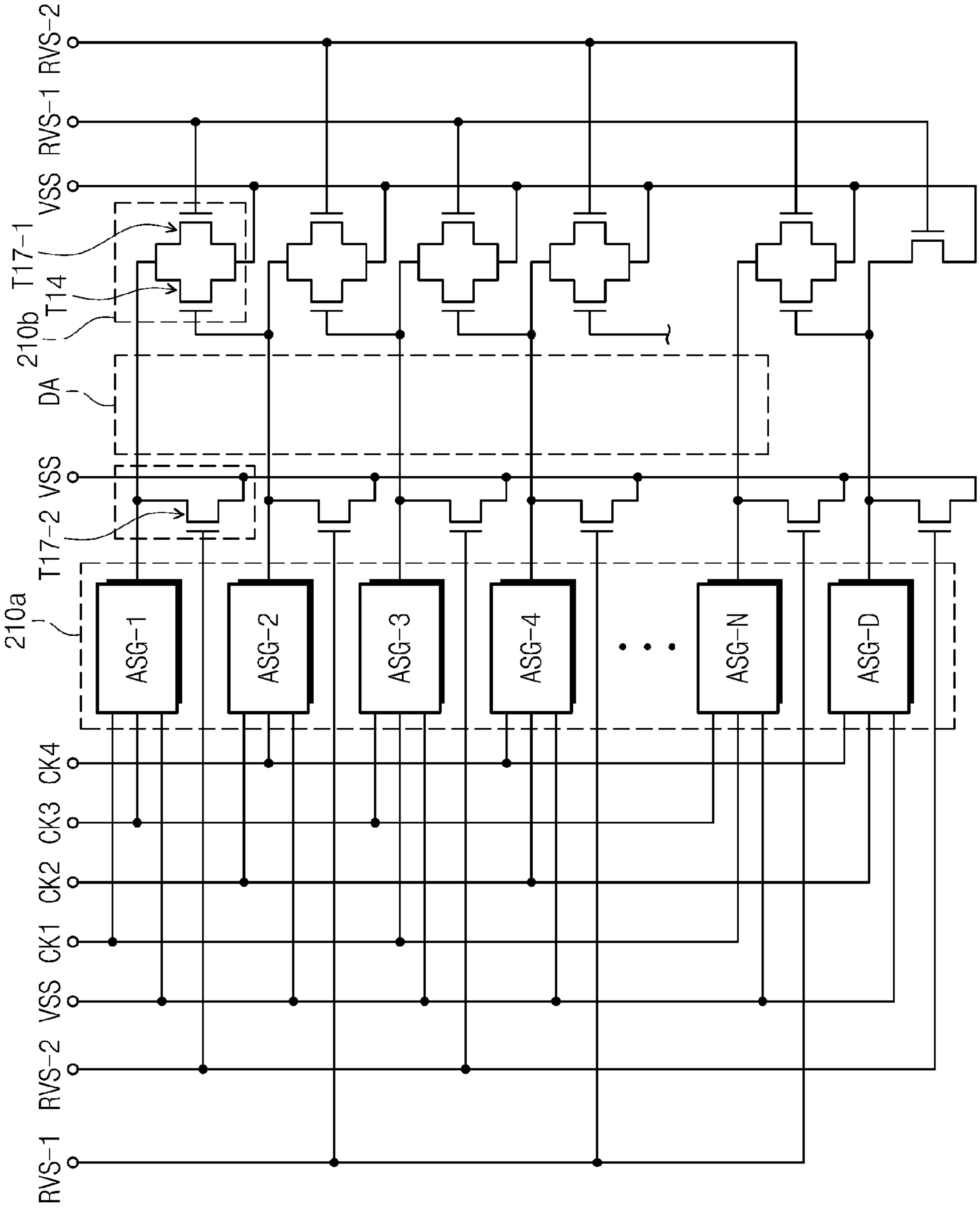
FIG. 9 is a block diagram showing a fourth exemplary embodiment of a gate driving circuit according to the present invention.

FIG. 9 is a block diagram showing a fourth exemplary embodiment of a gate driving circuit according to the present invention. In FIG. 9, the same reference numerals denote the same elements in first to third exemplary embodiments, and thus the detailed descriptions of the same elements will be omitted.

Referring to FIG. 9, each stage of a gate driving circuit 210 receives two of a first clock signal CK1, a second clock signal CK2, a third clock signal CK3, and a fourth clock signal CK4 to output a gate voltage. In the present exemplary embodiment, odd-numbered stages receive the first clock signal CK1 and the third clock signal CK3, and even-numbered stages receive the second clock signal CK2 and the fourth clock signal CK4. In a first odd-numbered stage ASG-1, the first clock signal CK1 is used as the gate voltage and the third clock signal CK3 is used as a clock signal to prevent the occurrence of the ripple effect. Then, in a next odd-numbered stage ASG-3, i.e., a second odd-numbered stage, the third clock signal CK3 is used as the gate voltage and the first clock signal CK1 is used as the clock signal to prevent the occurrence of the ripple effect. In a first even-numbered stage ASG-2, the second clock signal CK2 is used as the gate voltage and the fourth clock signal CK4 is used as the clock signal to prevent the occurrence of the ripple effect. Then, in a next even-numbered stage ASG-4, i.e., a second even-numbered stage, the fourth clock signal CK4 is used as the gate voltage and the second clock signal CK2 is used as the clock signal to prevent the occurrence of the ripple effect.

Meanwhile, a gate control circuit 332 includes a first NOR gate circuit 332-1 and a second NOR gate circuit 332-2. The first NOR gate circuit 332-1 receives the first and third clock signals CK1 and CK3 and outputs a first discharge control signal RVS-1 having a high state when both of the first and third clock signals CK1 and CK3 are in a low state. The second NOR gate circuit 332-2 receives the second and fourth clock signals CK2 and CK4 and outputs a second discharge control signal RVS-2 having a high state when both of the second and fourth clock signals CK2 and CK4 are in a low state. In the present exemplary embodiment, each of the first to fourth clock signals CK1~CK4 has a duty ratio smaller than about 50%. As an example, in one exemplary embodiment each of the first to fourth clock signals CK1~CK4 may have a duty ratio of about 37.5%. In addition, the first clock signal CK1 and the third clock signal CK3 have a phase difference of about 180 degrees, and the second clock signal CK2 and the fourth clock signal CK4 have a phase difference of about 180 degrees.

A discharge part 210*b* according to the present exemplary embodiment includes a first discharge transistor T14 that receives an output voltage from a next gate line to discharge a present gate line to an off-voltage VSS and a second discharge transistor T17-1 and a third discharge transistor T17-2 that discharge the present gate line to the off-voltage VSS in response to the first discharge control signal RVS-1.

When either the first clock signal CK1 or the third clock signal CK3 is in the high state, the odd-numbered stages are normally operated. In addition, when either the second clock signal CK2 or the fourth clock signal CK4 is in the high state, the even-numbered stages are normally operated. However, when both of the first and third clock signals CK1 and CK3 are in the low state or both of the second and fourth clock signals CK2 and CK4 are in the low state, no driving transistors of the odd-numbered stages and the even-numbered stages are operated, and thus all nodes of the odd-numbered stages and the even-numbered stages are charged with the floating state.

In the present exemplary embodiment, the first NOR gate circuit 332-1 outputs the first discharge control signal RVS-1 when both of the first and third clock signals CK1 and CK3 are in the low state, and the second NOR gate circuit 332-2 outputs the second discharge control signal RVS-2 when both of the second and fourth clock signals CK2 and CK4 are in the low state.

The first discharge control signal RVS-1 output from the first NOR gate circuit 332-1 is input to a control electrode of the second and third discharge transistors T17-1 and T17-2 of the odd-numbered stages, and the second discharge control signal RVS-2 output from the second NOR gate circuit 332-2 is applied to the control electrode of the second and third discharge transistors T17-1 and T17-2 of the even-numbered stages. When the second discharge transistor T17-1 and the third discharge transistor T17-2 of the odd-numbered stages and the even-numbered stages are turned on, the output voltage output from each stage is discharged to the off-voltage VSS. As a result, all nodes of each stage are maintained at an off-state.

Meanwhile, since the first discharge transistor T14 is operated by receiving the output voltage of a next stage through its control electrode, all nodes of a present stage are maintained at the off-state by an operation of the next stage. The last stage ASG-D, which is a dummy stage, does not receive the output voltage provided from a subsequent stage, and therefore the output voltage output from the last stage ASG-D is discharged to the off-voltage VSS by the second and third discharge transistors T17-1 and T17-2.

Embodiment 5

Figure 10:
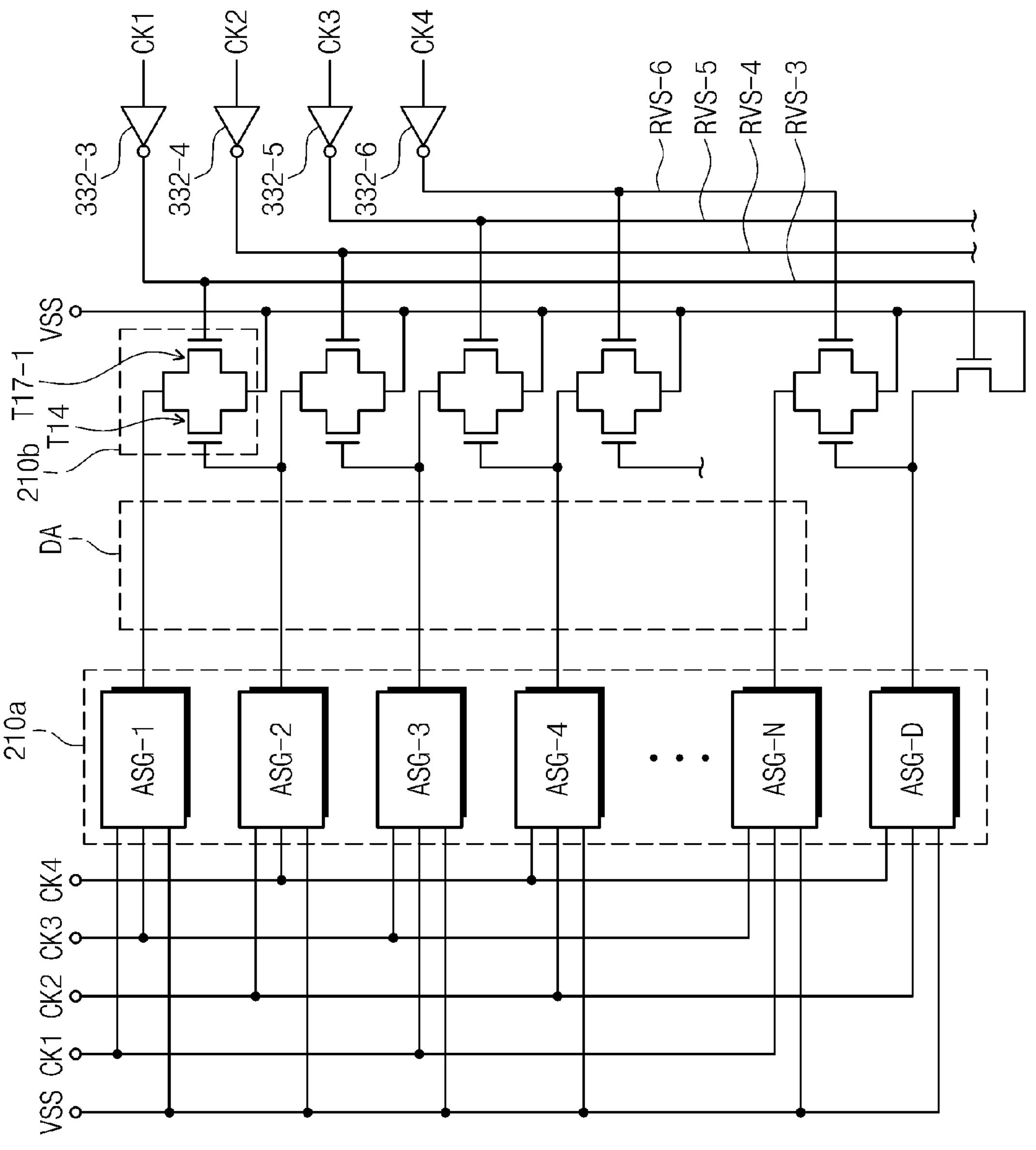
FIG. 10 is a block diagram showing a fifth exemplary embodiment of a gate driving circuit according to the present invention.
Figure 11:
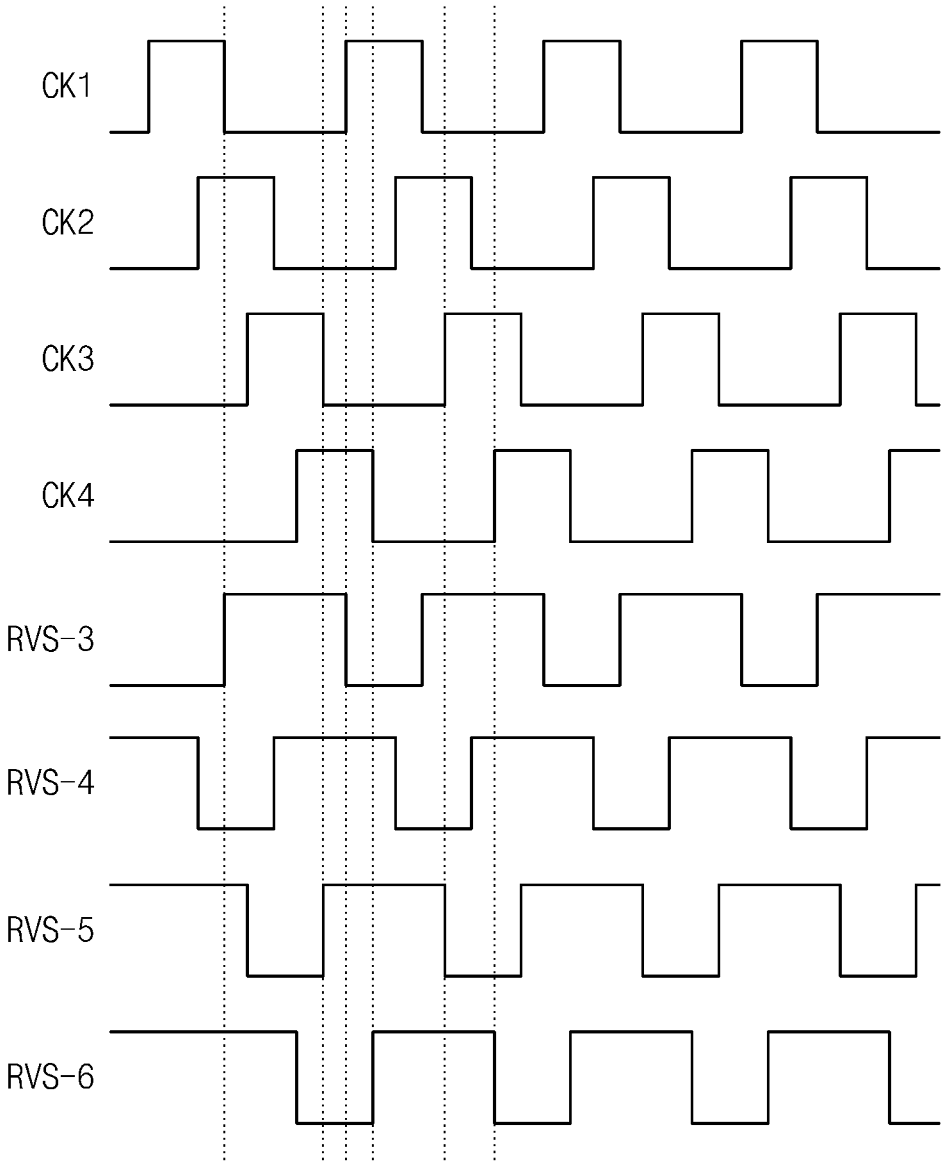
FIG. 11 is a timing diagram showing first to fourth clock signals and third to sixth discharge control signals of FIG. 10.

FIG. 10 is a block diagram showing a fifth exemplary embodiment of a gate driving circuit according to the present invention, and FIG. 11 is a timing diagram showing first to fourth clock signals and third to sixth discharge control signals of FIG. 10. In FIG. 10, the same reference numerals denote the same elements in the first to fourth exemplary embodiments, and thus the detailed descriptions of the same elements will be omitted.

Referring to FIGS. 10 and 11, each stage of a gate driving circuit 210 receives two of a first clock signal CK1, a second clock signal CK2, a third clock signal CK3, and a fourth clock signal CK4 to output a gate voltage. In the present exemplary embodiment, odd-numbered stages receive the first clock signal CK1 and the third clock signal CK3, and even-numbered stages receive the second clock signal CK2 and the fourth clock signal CK4. In a first odd-numbered stage ASG-1, the first clock signal CK1 is used as the gate voltage and the third clock signal CK3 is used as a clock signal to prevent occurrence of a ripple effect. Then, in a next odd-numbered stage ASG-3, i.e., a second odd-numbered stage, the third clock signal CK3 is used as the gate voltage and the first clock signal CK1 is used as the clock signal to prevent the occurrence of the ripple effect. In a first even-numbered stage ASG-2, the second clock signal CK2 is used as the gate voltage and the fourth clock signal CK4 is used as the clock signal to prevent the occurrence of the ripple effect. Then, in a next even-numbered stage ASG-4, i.e., a second even-numbered stage, the fourth clock signal CK4 is used as the gate voltage and the second clock signal CK2 is used as the clock signal to prevent the occurrence of the ripple effect.

Meanwhile, a gate control circuit 332 includes a first inverter circuit 332-3 that inverts the first clock signal CK1 to output a third discharge control signal RVS-3, a second inverter circuit 332-4 that inverts the second clock signal CK2 to output a fourth discharge control signal RVS-4, a third inverter circuit 332-5 that inverts the third clock signal CK3 to output a fifth discharge control signal RVS-5, and a fourth inverter circuit 332-6 that inverts the fourth clock signal CK4 to output a sixth discharge control signal RVS-6. In the present exemplary embodiment, each of the first to fourth clock signals CK1~CK4 has a duty ratio smaller than about 50%. As an example, in one exemplary embodiment each of the first to fourth clock signals CK1~CK4 may have a duty ratio of about 37.5%. In addition, the first clock signal CK1 and the third clock signal CK3 have a phase difference of about 180 degrees, and the second clock signal CK2 and the fourth clock signal CK4 have a phase difference of about 180 degrees.

A discharge part 210*b* according to the present exemplary embodiment includes a plurality of first discharge transistors T14 each receiving an output voltage from a next gate line and discharging a present gate line to an off-voltage VSS and a plurality of second discharge transistors T17-1 each discharging the present gate line to the off-voltage VSS in response to the third to sixth discharge control signals RVS-3~RVS-6.

Each of the first discharge transistors T14 includes a control electrode connected to the next gate line, an input electrode receiving the gate voltage of the present stage, and an output electrode receiving the off-voltage VSS. Among the second discharge transistors T17-1, a (4n-3)-th discharge transistor receives the third discharge control signal RVS-3 (wherein "n" is a natural number), a (4n-2)-th discharge transistor receives the fourth discharge control signal RVS-4, a (4n-1)-th discharge transistor receives the fifth discharge control signal RVS-5, and a 4n-th discharge transistor receives the sixth discharge control signal RVS-6.

As shown in FIG. 11, since the third and fifth discharge control signals RVS-3 and RVS-5 are obtained by inverting the first and third clock signals CK1 and CK3, respectively, the third and fifth discharge control signals RVS-3 and RVS-5 are in a high state during a period where the first and third clock signals CK1 and CK3 are in a low state, respectively. Also, since the fourth and sixth discharge control signals RVS-4 and RVS-6 are obtained by inverting the second and fourth clock signals CK2 and CK4, respectively, the fourth and sixth discharge control signals RVS-4 and RVS-6 are in the high state during a period where the second and fourth clock signals CK2 and CK4 are in the low state, respectively.

Thus, when the (4n-3)-th and (4n-1)-th second discharge transistors are turned on in the period during which both of the first and third clock signals CK1 and CK3 are in the low state in response to the third and fifth discharge control signals RVS-3 and RVS-5, an output voltage output from the odd-numbered stages is discharged to the off-voltage VSS. In addition, when the (4n-2)-th and 4n-th discharge transistors are turned on in the period during which both of the second and fourth clock signals CK2 and CK4 are in the low state in response to the fourth and sixth discharge control signals RVS-4 and RVS-6, an output voltage output from the even-numbered stages is discharged to the off-voltage VSS. Therefore, all nodes of each stage are maintained at an off-state.

Meanwhile, since the first discharge transistor T14 is operated by receiving the output voltage of a next stage through its control electrode, all nodes of the present stage are maintained at the off-state by an operation of the next stage. The last stage ASG-D, which is a dummy stage, does not receive the output voltage provided from a subsequent stage, and therefore the output voltage output from the last stage ASG-D is discharged to the off-voltage VSS by the second discharge transistor T17-1.

Embodiment 6

Figure 12:
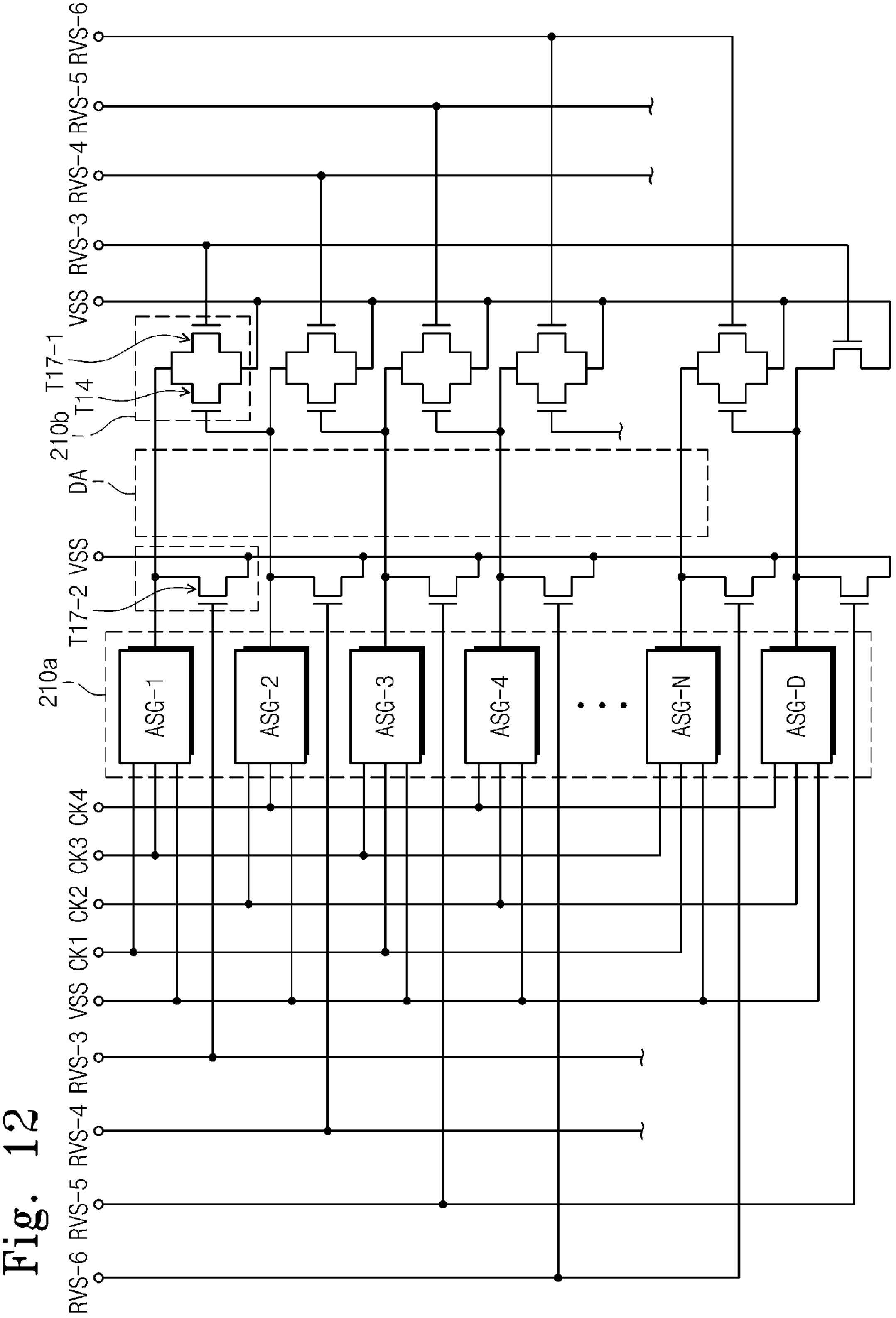
FIG. 12 is a block diagram showing a sixth exemplary embodiment of a gate driving circuit according to the present invention.

FIG. 12 is a block diagram showing a sixth exemplary embodiment of a gate driving circuit according to the present invention. In FIG. 12, the same reference numerals denote the same elements in first to fifth exemplary embodiments, and thus the detailed descriptions of the same elements will be omitted.

Referring to FIG. 12, each stage of a gate driving circuit 210 receives two of a first clock signal CK1, a second clock signal CK2, a third clock signal CK3, and a fourth clock signal CK4 to output a gate voltage. In the present exemplary embodiment, odd-numbered stages receive the first clock signal CK1 and the third clock signal CK3, and even-numbered stages receive the second clock signal CK2 and the fourth clock signal CK4. In a first odd-numbered stage ASG-1, the first clock signal CK1 is used as the gate voltage and the third clock signal CK3 is used as a clock signal to prevent the occurrence of the ripple effect. Then, in a next odd-numbered stage ASG-3, i.e., a second odd-numbered stage, the third clock signal CK3 is used as the gate voltage and the first clock signal CK1 is used as the clock signal to prevent the occurrence of the ripple effect. In a first even-numbered stage ASG-2, the second clock signal CK2 is used as the gate voltage and the fourth clock signal CK4 is used as the clock signal to prevent the occurrence of the ripple effect. Then, in a next even-numbered stage ASG-4, i.e., a second even-numbered stage, the fourth clock signal CK4 is used as the gate voltage and the second clock signal CK2 is used as the clock signal to prevent the occurrence of the ripple effect.

Meanwhile, a gate control circuit 332 (shown in FIG. 1) includes first, second, third, and fourth inverter circuits (refer to FIG. 10) that invert the first clock signal CK1, the second clock signal CK2, the third clock signal CK3, and the fourth clock signal CK4 to output a third discharge control signal RVS-3, a fourth discharge control signal RVS-4, a fifth discharge control signal RVS-5, and a sixth discharge control signal RVS-6, respectively. In the present exemplary embodiment, each of the first to fourth clock signals CK1~CK4 has a duty ratio smaller than about 50%. As an example, in one exemplary embodiment each of the first to fourth clock signals CK1~CK4 may have a duty ratio of about 37.5%. Also, the first clock signal CK1 and the third clock signal CK3 have a phase difference of about 180 degrees, and the second clock signal CK2 and the fourth clock signal CK4 have a phase difference of about 180 degrees.

A discharge part 210*b* according to the present exemplary embodiment includes a plurality of first discharge transistors T14 each receiving an output voltage from a next gate line and discharging a present gate line to an off-voltage VSS and a plurality of second discharge transistors T17-1 and a plurality of third discharge transistors T17-2 each discharging the present gate line to the off-voltage VSS in response to the third to sixth discharge control signals RVS-3~RVS-6.

Each of the first discharge transistors T14 includes a control electrode connected to the next gate line, an input electrode receiving the gate voltage of a present stage, and an output voltage receiving the off-voltage VSS.

Among the second discharge transistors T17-1, a (4n-3)-th discharge transistor receives the third discharge control signal RVS-3, a (4n-2)-th discharge transistor receives the fourth discharge control signal RVS-4, a (4n-1)-th discharge transistor receives the fifth discharge control signal RVS-5, and a 4n-th discharge transistor receives the sixth discharge control signal RVS-6.

Also, among the third discharge transistors T17-2, a (4n-3)-th discharge transistor receives the third discharge control signal RVS-3, a (4n-2)-th discharge transistor receives the fourth discharge control signal RVS-4, a (4n-1)-th discharge transistor receives the fifth discharge control signal RVS-5, and a 4n-th discharge transistor receives the sixth discharge control signal RVS-6.

As shown in FIG. 12, since the third and fifth discharge control signals RVS-3 and RVS-5 are obtained by inverting the first and third clock signals CK1 and CK3, respectively, the third and fifth discharge control signals RVS-3 and RVS-5 are in a high state when the first and third clock signals CK1 and CK3 are in a low state, respectively. In addition, since the fourth and sixth discharge control signals RVS-4 and RVS-6 are obtained by inverting the second and fourth clock signals CK2 and CK4, respectively, the fourth and sixth discharge control signals RVS-4 and RVS-6 are in the high state when the second and fourth clock signals CK2 and CK4 are in the low state, respectively.

Accordingly, when the (4n-3)-th and (4n-1)-th discharge transistors are turned on in a period during which both of the first and third clock signals CK1 and CK3 are in the low state in response to the third and fifth discharge control signals RVS-3 and RVS-5, an output voltage of the odd-numbered stages is discharged to the off-voltage VSS. In addition, when the (4n-2)-th and 4n-th discharge transistors are turned on in a period during which both of the second and fourth clock signals CK2 and CK4 are in the low state in response to the fourth and sixth discharge control signals RVS-4 and RVS-6, the output voltage of the even-numbered stages is discharged to the off-voltage VSS. Thus, all nodes of each stage are maintained at an off-state.

Meanwhile, since the first discharge transistor T14 is operated by receiving the output voltage of a next stage through its control electrode, all nodes of the present stage are maintained at the off-state by an operation of the next stage. The last stage ASG-D, which is a dummy stage, does not receive the output voltage from a subsequent stage, and therefore the output voltage output from the last stage ASG-D is discharged to the off-voltage VSS by the second and third discharge transistors T17-1 and T17-2.

Embodiment 7

Figure 13:
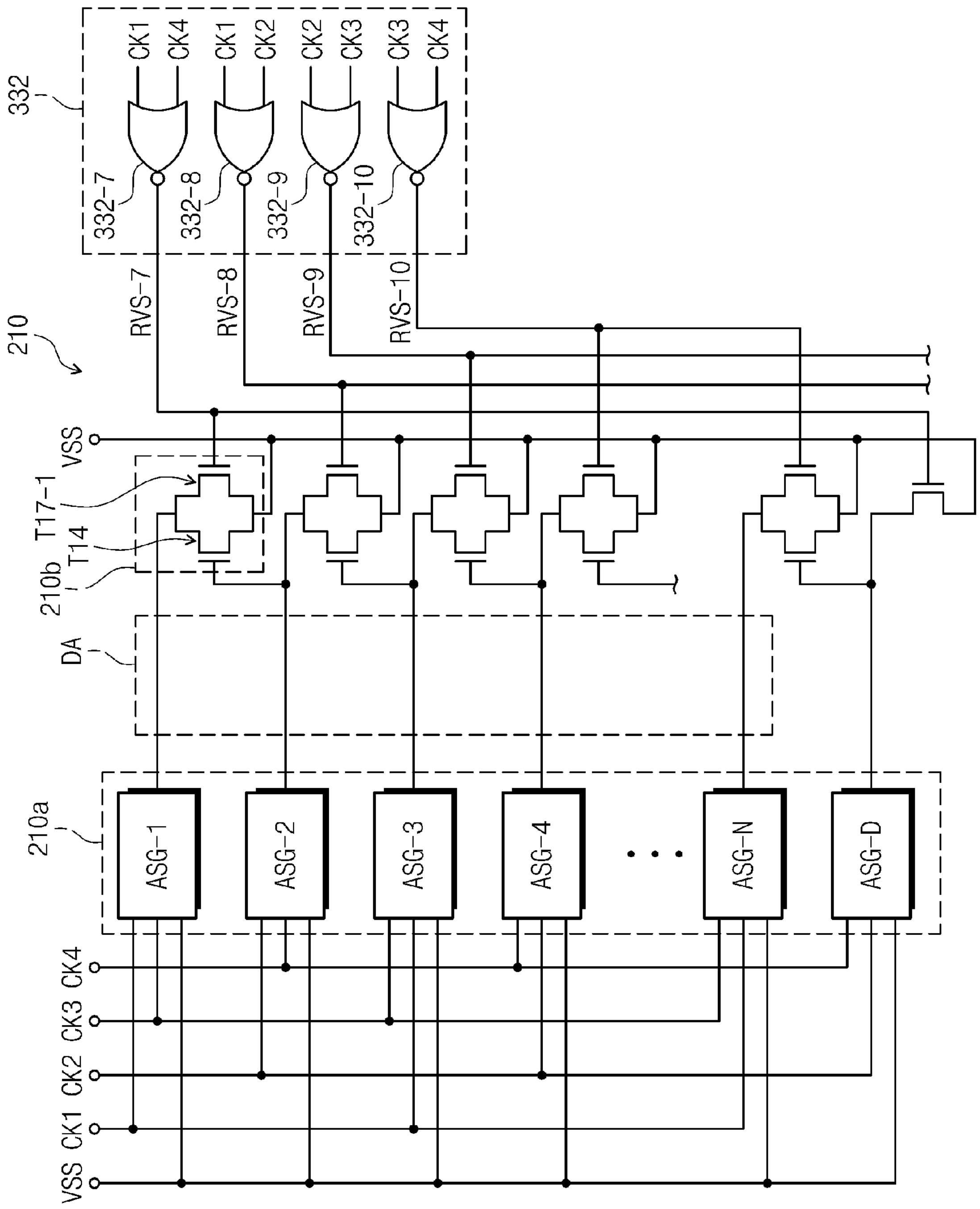
FIG. 13 is a block diagram showing a seventh exemplary embodiment of a gate driving circuit according to the present invention.
Figure 14:
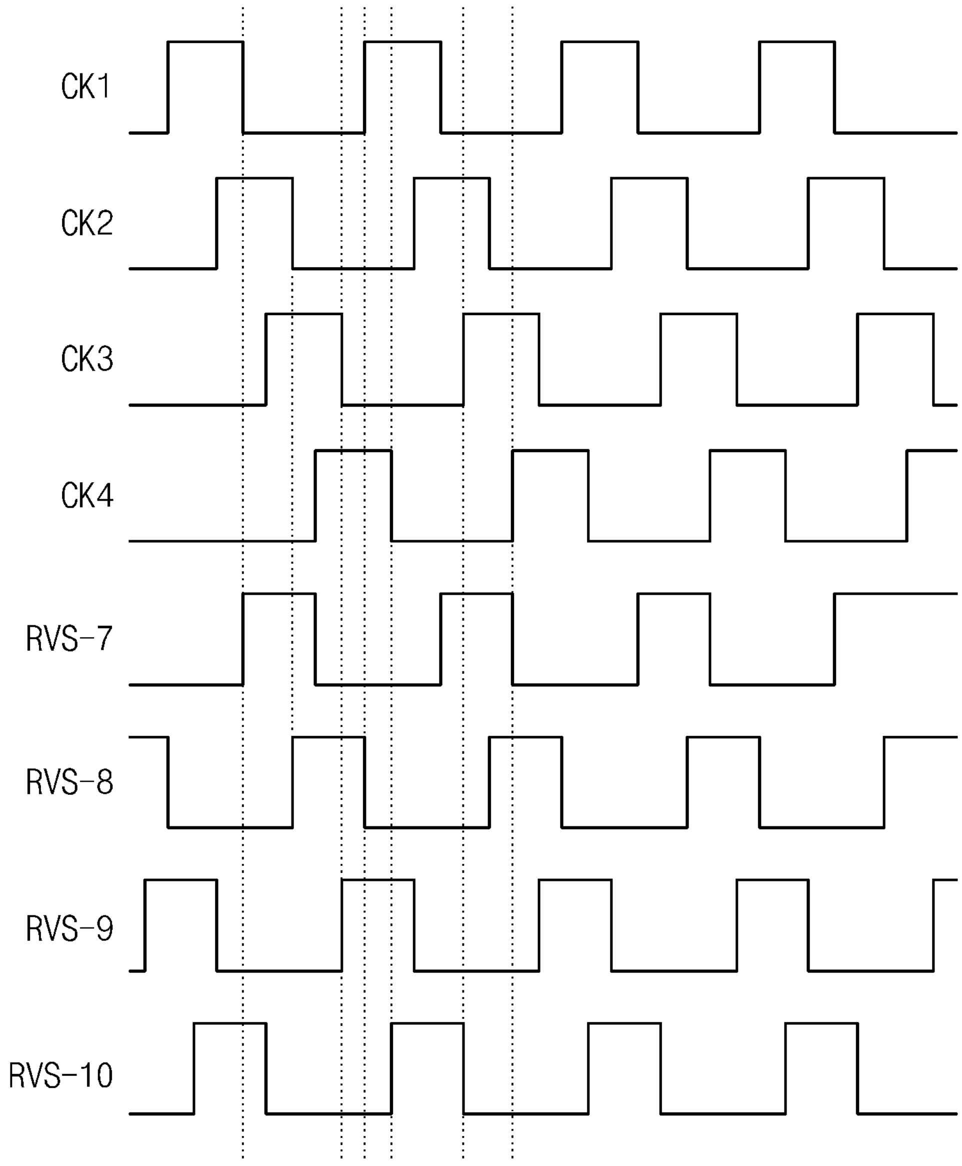
FIG. 14 is a timing diagram showing first to fourth clock signals and seventh to tenth discharge control signals of FIG. 13.

FIG. 13 is a block diagram showing a seventh exemplary embodiment of a gate driving circuit according to the present invention, and FIG. 14 is a timing diagram showing first to fourth clock signals CK1-CK4 and seventh to tenth discharge control signals RVS-7~RVS-10 of FIG. 13. In FIGS. 13 and 14, the same reference numerals denote the same elements in the first exemplary embodiment, and thus the detailed descriptions of the same elements will be omitted.

Referring to FIGS. 13 and 14, each stage of a gate driving circuit 210 receives two of a first clock signal CK1, a second clock signal CK2, a third clock signal CK3, and a fourth clock signal CK4 to output a gate voltage. In the present exemplary embodiment, odd-numbered stages receive the first clock signal CK1 and the third clock signal CK3, and even-numbered stages receive the second clock signal CK2 and the fourth clock signal CK4. In a first odd-numbered stage ASG-1, the first clock signal CK1 is used as the gate voltage and the third clock signal CK3 is used as a clock signal to prevent the occurrence of the ripple effect. Then, in a next odd-numbered stage ASG-3, i.e., a second odd-numbered stage, the third clock signal CK3 is used as the gate voltage and the first clock signal CK1 is used as the clock signal to prevent the occurrence of the ripple effect. In a first even-numbered stage ASG-2, the second clock signal CK2 is used as the gate voltage and the fourth clock signal CK4 is used as the clock signal to prevent the occurrence of the ripple effect. Then, in a next even-numbered stage ASG-4, i.e., a second even-numbered stage, the fourth clock signal CK4 is used as the gate voltage and the second clock signal CK2 is used as the clock signal to prevent the occurrence of the ripple effect.

Meanwhile, a gate control circuit 332 includes a seventh NOR gate circuit 332-7, an eighth NOR gate circuit 332-8, a ninth NOR gate circuit 332-9, and a tenth NOR gate circuit 332-10. The first NOR gate circuit 332-7 receives the first and fourth clock signals CK1 and CK4 and outputs a seventh discharge control signal RVS-7 at a high state when both of the first and fourth clock signals CK1 and CK4 are in a low state. The eighth NOR gate circuit 332-8 receives the first and second clock signals CK1 and CK2 and outputs an eighth discharge control signal RVS-8 at the high state when both of the first and second clock signals CK1 and CK2 are in the low state. The ninth NOR gate circuit 332-9 receives the second and third clock signals CK2 and CK3 and outputs a ninth discharge control signal RVS-9 at the high state when both of the second and third clock signals CK2 and CK3 are in the low state. The tenth NOR gate circuit 332-10 receives the third and fourth clock signals CK3 and CK4 and outputs a tenth discharge control signal RVS-10 at the high state when both of the third and fourth clock signals CK3 and CK4 are in the low state.

In the present exemplary embodiment, each of the first to fourth clock signals CK1~CK4 has a duty ratio smaller than about 50%. As an example, in one exemplary embodiment each of the first to fourth clock signals CK1~CK4 may have a duty ratio of about 37.5%. In addition, the first clock signal CK1 and the third clock signal CK3 have a phase difference of about 180 degrees, and the second clock signal CK2 and the fourth clock signal CK4 have a phase difference of about 180 degrees.

When either the first clock signal CK1 or the third clock signal CK3 is in the high state, the odd-numbered stages are normally operated. Also, when either the second clock signal CK2 or the fourth clock signal CK4 is in the high state, the even-numbered stages are normally operated. However, when both of the first and third clock signals CK1 and CK3 are in the low state or both of the second and fourth clock signals CK2 and CK4 are in the low state, all nodes of the odd-numbered stages and the even-numbered stages are charged with the floating state.

A discharge part 210*b* according to the present exemplary embodiment includes a plurality of first discharge transistors T14 each receiving an output voltage from a next gate line and discharging a present gate line to an off-voltage VSS and a plurality of second discharge transistors T17-1 each discharging the present gate line to the off-voltage VSS in response to the seventh to tenth discharge control signals RVS-7~RVS-10.

Each of the first discharge transistors T14 includes a control electrode connected to the next gate line, an input electrode receiving the gate voltage of the present stage, and an output electrode receiving the off-voltage VSS. Among the second discharge transistors T17-1, a (4n-3)-th discharge transistor receives the seventh discharge control signal RVS-7, a (4n-2)-th discharge transistor receives the eighth discharge control signal RVS-8, a (4n-1)-th discharge transistor receives the ninth discharge control signal RVS-9, and 4n-th discharge transistor receives the tenth discharge control signal RVS-10.

The seventh discharge control signal RVS-7 is applied to a control electrode of the (4n-3)-th discharge transistor T17-1. When the (4n-3)-th discharge transistor T17-1 is turned on in response to the seventh discharge control signal RVS-7, the output voltage of a (4n-3)-th stage is discharged to the off-voltage VSS. As shown in FIG. 14, the seventh discharge control signal RVS-7 is output in the high state when both of the first and fourth clock signals CK1 and CK4 are in the low state. Thus, all nodes of the (4n-3)-th stage are maintained at an off-state by the seventh discharge control signal RVS-7.

Also, the eighth discharge control signal RVS-8 is applied to a control electrode of the (4n-2)-th discharge transistor T17-1. When the (4n-2)-th discharge transistor T17-1 is turned on in response to the eighth discharge control signal RVS-8, the output voltage of a (4n-2)-th stage is discharged to the off-voltage VSS. As shown in FIG. 14, the eighth discharge control signal RVS-8 is output in the high state when both of the first and second clock signals CK1 and CK2 are in the low state. Thus, all nodes of the (4n-2)-th stage are maintained at the off-state by the eighth discharge control signal RVS-8.

The ninth discharge control signal RVS-9 is applied to a control electrode of the (4n-1)-th discharge transistor T17-1. When the (4n-1)-th discharge transistor T17-1 is turned on in response to the ninth discharge control signal RVS-9, the output voltage of a (4n-1)-th stage is discharged to the off-voltage VSS. As shown in FIG. 14, the ninth discharge control signal RVS-9 is output in the high state when both of the second and third clock signals CK2 and CK3 are in the low state. Thus, all nodes of the (4n-1)-th stage are maintained at the off-state by the ninth discharge control signal RVS-9.

The tenth discharge control signal RVS-10 is applied to a control electrode of the 4n-th discharge transistor T17-1. When the 4n-th discharge transistor T17-1 is turned on in response to the tenth discharge control signal RVS-10, the output voltage of a 4n-th stage is discharged to the off-voltage VSS. As shown in FIG. 14, the tenth discharge control signal RVS-10 is output in the high state when both of the third and fourth clock signals CK3 and CK4 are in the low state. Thus, all nodes of the 4n-th stage are maintained at the off-state by the tenth discharge control signal RVS-10.

As a result, all nodes of each stage are maintained at the off-state in a period where both of the first and third clock signals CK1 and CK3 are in the low state and in a period where both of the second and fourth clock signals CK2 and CK4 are in the low state.

Meanwhile, since the first discharge transistor T14 is operated by receiving the output voltage of a next stage through its control electrode, all nodes of the present stage are maintained at the off-state by an operation of the next stage. The last stage ASG-D, which is a dummy stage, does not receive the output voltage from a subsequent stage, and therefore the output voltage output from the last stage ASG-D is discharged to the off-voltage VSS by the second discharge transistor T17-1.

Embodiment 8

Figure 15:
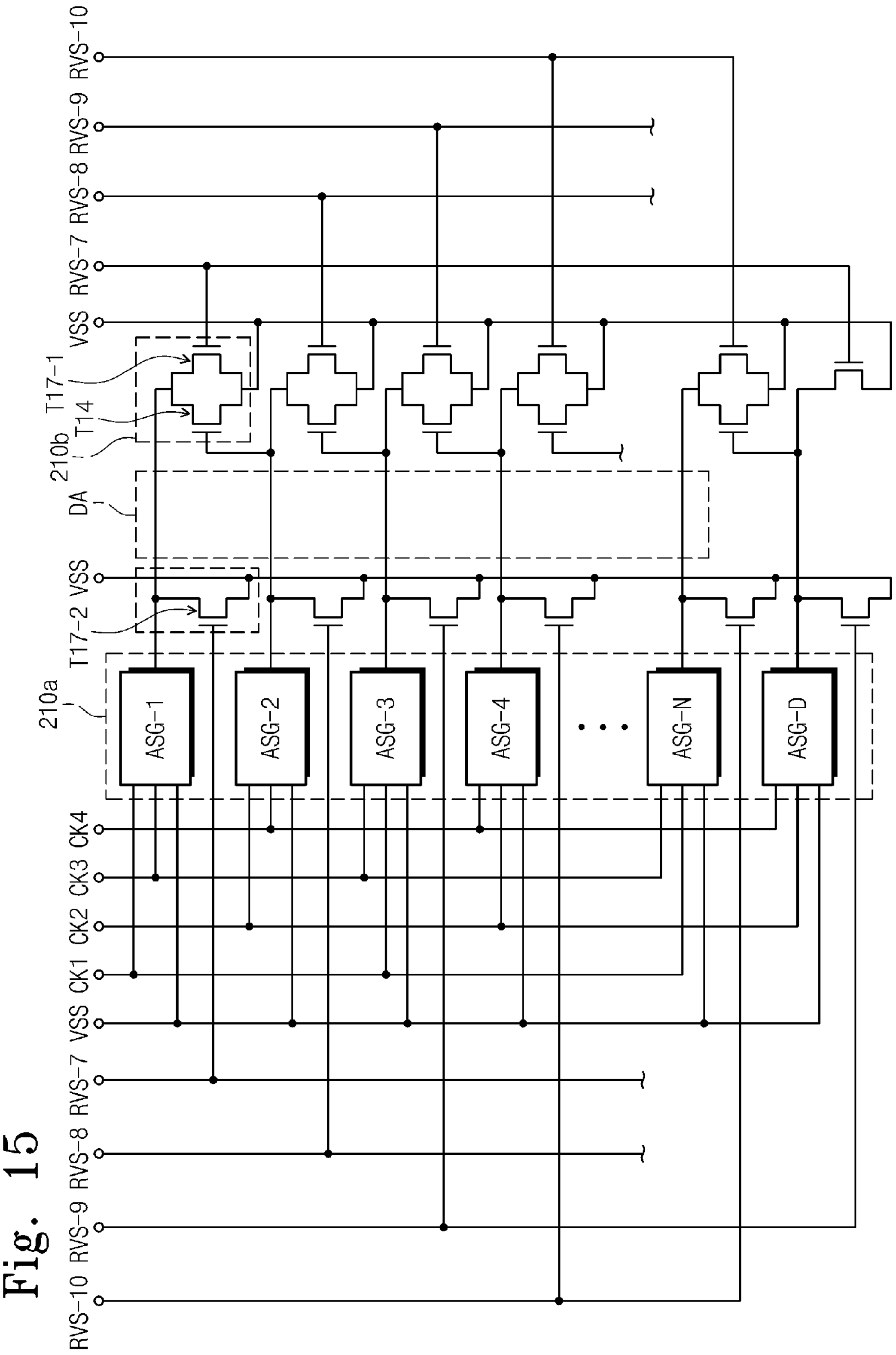
FIG. 15 is a block diagram showing an eight exemplary embodiment of a gate driving circuit according to the present invention.

FIG. 15 is a block diagram showing an eighth exemplary embodiment of a gate driving circuit according to the present invention. In FIG. 15, the same reference numerals denote the same elements in the first to seventh exemplary embodiments, and thus the detailed descriptions of the same elements will be omitted.

Referring to FIG. 15, each stage of a gate driving circuit 210 receives two of a first clock signal CK1, a second clock signal CK2, a third clock signal CK3, and a fourth clock signal CK4 to output a gate voltage. In the present exemplary embodiment, odd-numbered stages receive the first clock signal CK1 and the third clock signal CK3, and even-numbered stages receive the second clock signal CK2 and the fourth clock signal CK4. In a first odd-numbered stage ASG-1, the first clock signal CK1 is used as the gate voltage and the third clock signal CK3 is used as a clock signal to prevent the occurrence of the ripple effect. Then, in a next odd-numbered stage ASG-3, i.e., a second odd-numbered stage, the third clock signal CK3 is used as the gate voltage and the first clock signal CK1 is used as the clock signal to prevent the occurrence of the ripple effect. In a first even-numbered stage ASG-2, the second clock signal CK2 is used as the gate voltage and the fourth clock signal CK4 is used as the clock signal to prevent the occurrence of the ripple effect. Then, in a next even-numbered stage ASG-4, i.e., a second even-numbered stage, the fourth clock signal CK4 is used as the gate voltage and the second clock signal CK2 is used as the clock signal to prevent the occurrence of the ripple effect.

Meanwhile, a gate control circuit 332 (shown in FIG. 1) includes first, second, third, and fourth inverter circuits (refer to FIG. 10) which invert the first to fourth clock signals CK1~CK4 to output a seventh discharge control signal RVS-7, an eighth discharge control signal RVS-8, a ninth discharge control signal RVS-9, and a tenth discharge control signal RVS-10, respectively. In the present exemplary embodiment, each of the first to fourth clock signals CK1~CK4 has a duty ratio smaller than about 50%. As an example, in one exemplary embodiment each of the first to fourth clock signals CK1~CK4 may have a duty ratio of about 37.5%. In addition, the first clock signal CK1 and the third clock signal CK3 have a phase difference of about 180 degrees, and the second clock signal CK2 and the fourth clock signal CK4 have a phase difference of about 180 degrees.

A discharge part 210*b* according to the present exemplary embodiment includes a plurality of first discharge transistors T14 each receiving an output voltage from a next gate line and discharging a present gate line to an off-voltage VSS and a plurality of second discharge transistors T17-1 and a plurality of third discharge transistors T17-2 each discharging the present gate line to the off-voltage VSS in response to the seventh to tenth discharge control signals RVS-7~RVS-10.

Each of the first discharge transistors T14 includes a control electrode connected to the next gate line, an input electrode receiving the gate voltage of a present stage, and an output electrode receiving the off-voltage VSS.

Among the second discharge transistors T17-1, a (4n-3)-th discharge transistor receives the seventh discharge control signal RVS-7, a (4n-2)-th discharge transistor receives the eighth discharge control signal RVS-8, a (4n-1)-th discharge transistor receives the ninth discharge control signal RVS-9, and a 4n-th discharge transistor receives the tenth discharge control signal RVS-10.

Also, among the third discharge transistors T17-2, a (4n-3)-th discharge transistor receives the seventh discharge control signal RVS-7, a (4n-2)-th discharge transistor receives the eighth discharge control signal RVS-8, a (4n-1)-th discharge transistor receives the ninth discharge control signal RVS-9, and a 4n-th discharge transistor receives the tenth discharge control signal RVS-10.

As shown in FIG. 15, the seventh discharge control signal RVS-7 is output in a high state when both of the first and fourth clock signals CK1 and CK4 are in a low state, the eighth discharge control signal RVS-8 is output in the high state when both of the first and second clock signals CK1 and CK2 are in the low state, the ninth discharge control signal RVS-9 is output in the high state when both of the second and third clock signals CK2 and CK3 are in the low state, and the tenth discharge control signal RVS-10 is output in the high state when both of the third and fourth clock signals are in the low state.

Accordingly, when the (4n-3)-th and (4n-1)-th discharge transistors are turned on in a period where both of the first and third clock signals CK1 and CK3 are in the low state in response to the seventh and ninth discharge control signals RVS-7 and RVS-9, the output voltage of the odd-numbered stages is discharged to the off-voltage VSS. Also, when the (4n-2)-th and 4n-th discharge transistors are turned on in a period where both of the second and fourth clock signals CK2 and CK4 are in the low state in response to the eighth and tenth discharge control signals RVS-8 and RVS-10, the output voltage of the even-numbered stages is discharged to the off-voltage VSS. Thus, all nodes of each stage are maintained at an off-state.

Meanwhile, since the first discharge transistor T14 is operated by receiving the output voltage of a next stage through its control electrode, all nodes of the present stage are maintained at the off-state by an operation of the next stage. The last stage ASG-D, which is a dummy stage, does not receive the output voltage from a subsequent stage, and therefore the output voltage output from the last stage ASG-D is discharged to the off-voltage VSS by the second and third discharge transistors T17-1 and T17-2.

Consequently, the discharge control signal may be generated using the clock signal input to the gate driving circuit, and the generated discharge control signal is applied to the discharge transistor to operate the discharge transistor. As a result, the floating period occurring in the operation of the gate driving circuit may be removed, thereby preventing the occurrence of defects in display quality.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A gate driving circuit including a plurality of stages which are connected to each other one after another and each stage of the plurality of stages outputs a gate voltage to a corresponding gate line of a plurality of gate lines in response to at least one clock signal, each stage of the plurality of stages comprising:

a voltage output part which outputs the gate voltage;

an output driving part which drives the voltage output part;

a holding part which holds the gate line at an off-voltage; and a discharge part arranged at a first end of the gate line to discharge the corresponding gate line to the off-voltage in response to the gate voltage output from the voltage output part, wherein the discharge part comprises:

a first discharge circuit which receives the gate voltage output from the voltage output part to discharge the gate voltage to the off-voltage; and a second discharge circuit which discharges the gate voltage output from the voltage output part to the off-voltage in response to a discharge control signal, and wherein each stage of the plurality of stages receives the at least one clock signal comprises a first clock signal and a second clock signal, each of the first clock signal and the second clock signals has a duty ratio that is larger than 0% and smaller than 50%, wherein the discharge control signal is generated based on states of the first clock signal and the second clock signal, and wherein the discharge control signal is in a high state when both of the first clock signal and the second clock signal are in a low state.

2. The gate driving circuit of claim 1, wherein the discharge part further comprises a third discharge circuit arranged at a second end of the corresponding gate line, wherein the discharge part receives the discharge control signal and discharges the gate voltage output from the voltage output part to the off-voltage.

3. The gate driving circuit of claim 2, wherein the third discharge circuit comprises a transistor including a control electrode which receives the discharge control signal, an input electrode connected to the corresponding gate line, and an output electrode which receives the off-voltage.

4. The gate driving circuit of claim 1, wherein the first discharge circuit comprises a transistor including a control electrode connected to at least one gate line corresponding to a subsequent stage, an input electrode connected to the corresponding gate line, and an output electrode which receives the off-voltage.

5. The gate driving circuit of claim 1, wherein the second discharge circuit comprises a transistor including a control electrode which receives the discharge control signal, an input electrode connected to the corresponding gate line, and an output electrode which receives the off-voltage.

6. The gate driving circuit of claim 1, wherein the first clock signal has a phase which is different and offset from the second clock signal.

7. The gate driving circuit of claim 1, wherein each stage of the plurality of stages receives two of first through fourth clock signals, each of the first to fourth clock signals has a duty ratio that is larger than 0% and smaller than 50%, and the first to fourth clock signals all have phases which are different from each other.

8. The gate driving circuit of claim 7, wherein the discharge control signal comprises:

a first discharge control signal which is in a high state when both of the first clock signal and the third clock signal are in a low state; and a second discharge control signal which is in a high state when both of the second clock signal and the fourth clock signal are in a low state.

9. The gate driving circuit of claim 7, wherein the discharge control signal comprises:

a third discharge control signal which is an inversion of the first clock signal;

a fourth discharge control signal which is an inversion of the second clock signal;

a fifth discharge control signal which is an inversion of the third clock signal; and a sixth discharge control signal which is an inversion of the fourth clock signal.

10. The gate driving circuit of claim 7, wherein the discharge control signal comprises:

a seventh discharge control signal which is in a high state when both of the first clock signal and the fourth clock signals are in a low state;

an eighth discharge control signal which is in a high state when both of the first clock signal and the second clock signal are in a low state;

a ninth discharge control signal which is in a high state when both of the second clock signal and the third clock signal are in a low state; and a tenth discharge control signal which is in a high state when both of the third clock signal and the fourth clock signal are in a low state.

11. A display apparatus comprising:

a plurality of pixels arranged in a matrix configuration;

a plurality of gate lines which apply a gate signal to the plurality of pixels;

a plurality of data lines which apply a data signal to the plurality of pixels;

a gate driver connected to the gate lines, the gate driver comprises a plurality of stages connected to each other one after another and each stage of the plurality of stages outputs the gate signal to a corresponding present gate line in response to the at least one clock signal;

a data driver connected to the data lines, wherein the data driver generates the data signal; and a controller which controls an operation of the gate driver and the data driver, wherein the gate driver comprises:

a first discharge circuit arranged at a first end of the plurality of gate lines, wherein the first discharge circuit discharges the gate signal to an off-voltage; and a second discharge circuit which discharges the gate signal to the off-voltage in response to a discharge control signal output from the controller, and wherein each stage of the plurality of stages receives the at least one clock signal comprises a first clock signal and a second clock signal, each of the first clock signal and the second clock signal having a duty ratio that is larger than 0% and smaller than 50%, wherein the discharge control signal is generated based on states of the first clock signal and the second clock signal, and wherein the discharge control signal is in a high state when both the first clock signal and the second clock signal are in a low state.

12. The display apparatus of claim 11, wherein each stage of the plurality of stages comprises:

a voltage output part which outputs the gate signal;

an output driving part which drives the voltage output part; and a holding part which holds the gate line at the off-voltage.

13. The display apparatus of claim 12, further comprising a third discharge circuit arranged at a second end of the plurality of gate lines, wherein the third discharge circuit receives the discharge control signal and discharges the gate signal output from the voltage output part to the off-voltage.

14. The display apparatus of claim 13, wherein the third discharge circuit comprises a transistor comprising:

a control electrode which receives the discharge control signal;

an input electrode connected to the present gate line; and an output electrode which receives the off-voltage.

15. The display apparatus of claim 12, wherein the first discharge circuit comprises a transistor comprising:

a control electrode connected to a gate line subsequent to the present gate line;

an input electrode connected to the present gate line; and an output electrode which receives the off-voltage.

16. The display apparatus of claim 12, wherein the second discharge circuit comprises:

a transistor comprising a control electrode which receives the discharge control signal;

an input electrode connected to the present gate line; and an output electrode which receives the off-voltage.

17. The display apparatus of claim 11, wherein the first clock signal having a phase which is different and offset from a phase of the second clock signal.

18. The display apparatus of claim 11, wherein each stage of the plurality of stages receives two of first through fourth clock signals, each of the first to fourth clock signals has a duty ratio that is larger than 0% and smaller than 50%, and the first to fourth clock signals each have different phases from each other.

19. The display apparatus of claim 18, wherein the discharge control signal comprises:

a first discharge control signal which is in a high state when both of the first clock signal and the third clock signal are in a low state; and a second discharge control signal which is in a high state when both of the second clock signal and the fourth clock signal are in a low state.

20. The display apparatus of claim 18, wherein the discharge control signal comprises:

a third discharge control signal which is an inverse of the first clock signal;

a fourth discharge control signal which is an inverse of the second clock signal;

a fifth discharge control signal which is an inverse of the third clock signal; and a sixth discharge control signal which is an inverse of the fourth clock signal.

21. The display apparatus of claim 18, wherein the discharge control signal comprises:

a seventh discharge control signal which is in a high state when both of the first clock signal and the fourth clock signal are in a low state;

an eighth discharge control signal which is in a high state when both of the first clock signal and the second clock signal are in a low state;

a ninth discharge control signal which is in a high state when both of the second clock signal and the third clock signal are in a low state; and a tenth discharge control signal which is in a high state when both of the third clock signal and the fourth clock signal are in a low state.

* * * * *